United States Patent
Lim et al.

(10) Patent No.: US 9,548,316 B2
(45) Date of Patent: Jan. 17, 2017

(54) SEMICONDUCTOR DEVICE

(71) Applicants: Joon-Sung Lim, Yongin-si (KR); Jang-Gn Yun, Hwaseong-si (KR); Sunghoon Bae, Osan-si (KR); Jaesun Yun, Anyang-si (KR); Kyu-Baik Chang, Seoul (KR)

(72) Inventors: Joon-Sung Lim, Yongin-si (KR); Jang-Gn Yun, Hwaseong-si (KR); Sunghoon Bae, Osan-si (KR); Jaesun Yun, Anyang-si (KR); Kyu-Baik Chang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/959,209

(22) Filed: Dec. 4, 2015

(65) Prior Publication Data
US 2016/0163730 A1    Jun. 9, 2016

(30) Foreign Application Priority Data

Dec. 9, 2014 (KR) .......................... 10-2014-0175816

(51) Int. Cl.
  *H01L 27/12*     (2006.01)
  *H01L 27/115*    (2006.01)
  *H01L 27/06*     (2006.01)

(52) U.S. Cl.
  CPC ..... *H01L 27/11582* (2013.01); *H01L 27/0688* (2013.01); *H01L 27/11573* (2013.01); *H01L 27/11575* (2013.01)

(58) Field of Classification Search
  CPC ............ H01L 27/11582; H01L 27/0688; H01L 27/11573; H01L 27/11575; H01L 29/4234; H01L 27/11568
  USPC ........................................................ 257/347
  See application file for complete search history.

(56) References Cited

U.S. PATENT DOCUMENTS

| | | | |
|---|---|---|---|
| 6,251,726 B1 * | 6/2001 | Huang | H01L 27/10894 257/E21.013 |
| 7,719,056 B2 * | 5/2010 | Hamamoto | H01L 21/764 257/347 |
| 7,982,313 B2 * | 7/2011 | Grillberger | H01L 23/3677 257/211 |
| 8,531,901 B2 | 9/2013 | Ogiwara et al. | |
| 2010/0320526 A1 | 12/2010 | Kidoh et al. | |

FOREIGN PATENT DOCUMENTS

KR      10-1212709      12/2012

* cited by examiner

*Primary Examiner* — Luan C Thai
(74) *Attorney, Agent, or Firm* — Volentine & Whitt, PLLC

(57) ABSTRACT

A semiconductor device includes a logic structure including a logic circuit disposed in a circuit region and a lower insulation covering the logic circuit, a memory structure on the logic structure, a stress relaxation structure interposed between the logic structure and the memory structure in the circuit region, and a connection structure electrically connecting the memory structure to the logic circuit along a conductive path that extends through a connection region of the device beside the circuit region.

20 Claims, 38 Drawing Sheets

SEMICONDUCTOR DEVICE

PRIORITY STATEMENT

This U.S. non-provisional patent application claims priority under 35 U.S.C. §119 to Korean Patent Application No. 10-2014-0175816, filed on Dec. 9, 2014, in the Korean Intellectual Property Office, the disclosure of which is hereby incorporated by reference in its entirety.

BACKGROUND

The inventive concepts relate to semiconductor devices and methods of manufacturing the same. More particularly, the inventive concepts relate to non-volatile semiconductor memory devices and methods of manufacturing the same.

The integration density of semiconductor memory devices may be proportional to the cost of the semiconductor memory devices. A conventional two-dimensional (2D) memory device includes a planar array of unit memory cells formed of fine patterns of certain elements and features. The integration density of such a conventional two-dimensional (2D) memory device mainly corresponds to the area occupied by a unit memory cell of the device. Thus, the degree to which the integration density of a 2D memory device can be increased greatly depends on advances in techniques of forming fine patterns. However, apparatuses for forming fine patterns are very expensive to begin with and the cost of these apparatuses will only increase along with the fineness of the patterns that they are able to produce. Therefore, manufacturing costs may impose limits on the extent to which the integration densities of 2D memory devices are increased. In light of this, three-dimensional (3D) semiconductor devices have been developed. Three-dimensional (3D) semiconductor memory devices provide high integration densities and excellent performance while being relative inexpensive to manufacture per unit memory cell.

SUMMARY

According to one aspect of the inventive concepts, there is provided a semiconductor device comprising a semiconductor substrate, a logic structure including a logic circuit at an upper part of the semiconductor substrate in a circuit region of the device, and lower insulation covering the logic circuit, a memory structure disposed on the logic structure, and a stress relaxation structure interposed between the logic structure and the memory structure in the circuit region.

According to one aspect of the inventive concepts, there is provided a semiconductor device comprising a logic section, a memory section and a stress relaxation section. The logic section includes a logic circuit in a circuit region of the device, and lower insulation disposed on a substrate in the circuit region and in a connection region of the device that is alongside the circuit region, the lower insulation covering the logic circuit in the circuit region. The memory section is confined to the circuit region, is disposed on the logic section, and includes a stack of layers, the stack comprising semiconductor memory elements disposed at a plurality of levels above the substrate, and each of the memory elements is capable of storing data. The stress relaxation section is interposed between the logic section and the memory section in the circuit region and is composed to relieve stress which would otherwise be present in the device due to at least the stack of layers of the memory section.

According to another aspect of the inventive concepts, there is provided a semiconductor device comprising a logic section, a memory section, a connection section and stress relaxation means for relieving stress in the device created by the memory section and/or the connection section. The logic section includes a logic circuit in a circuit region of the device, and lower insulation disposed on a substrate in the circuit region and in a connection region of the device that is alongside the circuit region, the lower insulation covering the logic circuit in the circuit region. The memory section is confined to the circuit region, is disposed on the logic structure, and comprises an array of semiconductor memory elements, each of the semiconductor memory elements being capable of storing data. The connection section is disposed on the substrate in the connection region and electrically connects the memory section and the logic circuit.

According to still another aspect of the inventive concepts, there is provided a semiconductor device comprising a logic circuit in a circuit region of the device, lower insulation disposed on a substrate in the circuit region and in a connection region of the device that is alongside the circuit region, the lower insulation covering the logic circuit in the circuit region, an array of semiconductor memory (data storage) elements on the lower insulation and confined to the circuit region of the device, intermediate insulation disposed on the lower insulation in the connection region of the device and terminating at a boundary between the connection region and the circuit region, a stress relaxing cavity delimited between the array of semiconductor memory elements and the logic circuit by the intermediate insulation and an upper surface of the lower insulation, upper insulation disposed on the semiconductor memory elements in the circuit region and on the intermediate insulation in the connection region, and an electrically conductive via extending vertically through the upper insulation and the intermediate insulation in the connection region and electrically connecting the array of semiconductor memory elements to the logic circuit.

According to yet another aspect of the inventive concepts, there is provided a semiconductor device comprising a logic circuit in a circuit region of the device, lower insulation disposed on a substrate in the circuit region and in a connection region of the device that is alongside the circuit region, the lower insulation covering the logic circuit in the circuit region, an array of semiconductor memory elements on the lower insulation and confined to the circuit region of the device, each of the semiconductor memory elements being capable of storing data, intermediate insulation disposed on the lower insulation in the connection region of the device and terminating at a boundary between the connection region and the circuit region, a stress relaxation layer interposed between the array of semiconductor memory elements and the logic circuit and having an interface with the intermediate insulation at a boundary between the circuit region and the insulation region, upper insulation disposed on the semiconductor memory elements in the circuit region and on the intermediate insulation in the connection region, and an electrically conductive via extending vertically through the upper insulation and the intermediate insulation in the connection region and electrically connecting the array of semiconductor memory elements to the logic circuit.

BRIEF DESCRIPTION OF THE DRAWINGS

The inventive concepts will become more apparent in view of the attached drawings and accompanying detailed description.

FIGS. 8A-15B illustrate an embodiment of a method of manufacturing a semiconductor device according to the inventive concepts, wherein FIGS. 8A, 9A, 10A, 11A, 12A, 13A, 14A and 15A are cross-sectional views of the device during the course of its manufacture as taken in a direction corresponding to that of line I-I' of FIG. 5, and FIGS. 8B, 9B, 10B, 11B, 12B, 13B, 14B and 15B are cross-sectional views of the device during the course of its manufacture as taken in a direction corresponding to that of line II-II' of FIG. 5;

DETAILED DESCRIPTION OF THE PREFERRED EMBODIMENTS

Figure 1:
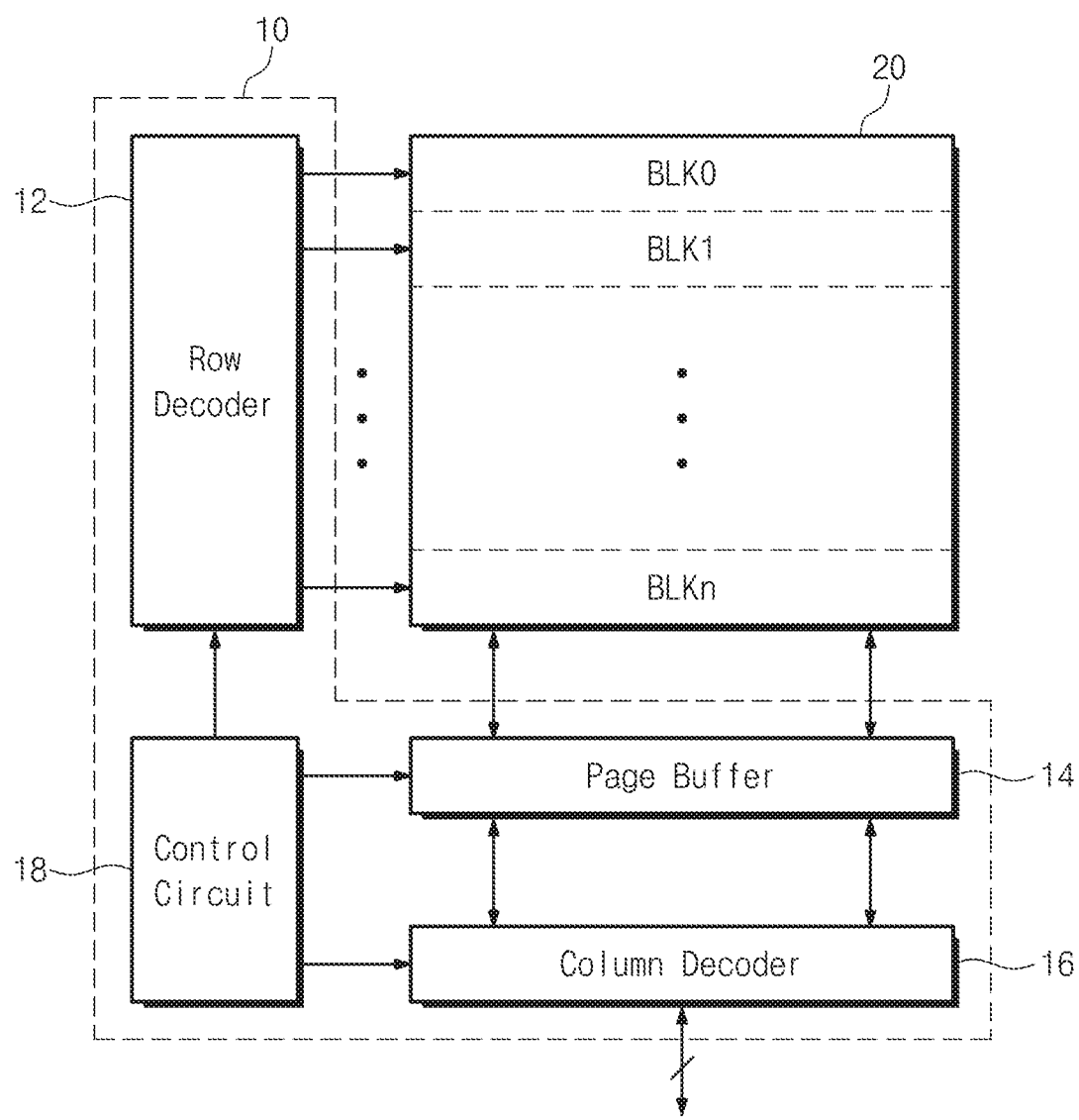
FIG. 1 is a schematic block diagram of a representative embodiment of semiconductor devices according to the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Other terminology used herein for the purpose of describing particular examples or embodiments of the inventive concept is to be taken in context. For example, the term "pattern" may at times be used to refer to one feature or element in a series of similar features or elements that have been formed by some patterning process and/or may refer collectively to the entire series of features or elements formed by the patterning process. Also, when an element or feature is described as "extending" in a particular direction, it will be understood that such direction generally corresponds to the lengthwise direction, i.e., the greatest dimension, of the element or feature, especially one having a line-shaped form, as the context and drawings will make clear. The term "semiconductor substrate" may at times refer simply to a body of semiconductor material other than that which has been processed to form circuit elements. The term "layer" may be used at times as shorthand to designate a section of the device having one or more layers as the description and drawings will otherwise make clear. The term "connected" will generally imply an electrical connection, i.e., even when not explicitly stated, as the drawings and context will make clear.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

An example of components that may make up embodiments of semiconductor devices according to the inventive concepts will now be described with reference to the block diagram of FIG. 1

A semiconductor device (e.g., a memory device) according to the inventive concepts may include a control logic 10 and a memory cell array 20. The control logic 10 may include a row decoder 12, a page buffer 14, a column decoder 16, and a control circuit 18. The memory cell array 20 may include a plurality of memory blocks BLK0 to BLKn, and each of the memory blocks BLK0 to BLKn may include a plurality of memory cells, a plurality of word lines, and a plurality of bit lines. The word lines and bit lines may be electrically connected to the memory cells.

The row decoder 12 may decode an address signal inputted from an external device to select one of the word lines. The address signal decoded by the row decoder 12 may be provided to a row driver (not shown). The row driver may provide a selection word line voltage and non-selection word line voltages generated from a voltage generation circuit (not shown) to the selected word line and unselected word lines, respectively, in response to a control signal of the control circuit 18. The row decoder 12 may be connected in common to the plurality of memory blocks BLK0 to BLKn and may provide driving signals (e.g., the selection and non-selection word line voltages) to the word lines of one of the memory blocks BLK0 to BLKn selected in response to a block selection signal.

The page buffer 14 may be connected to the memory cell array 20 through the bit lines and may sense data stored in the memory cells. The page buffer 14 may be connected to a selected bit line in response to an address signal decoded by the column decoder 16. Depending on the operation mode, the page buffer 14 may temporarily store data to be stored in the memory cells or may sense data stored in the memory cells. For example, the page buffer 14 may operate as a write driver circuit during a program operation mode and may operate as a sense amplifier circuit during a read operation mode. The page buffer 14 may receive power (e.g., a voltage or a current) from the control circuit 18 and may provide the power to the selected bit line.

The column decoder 16 may provide a data transmission path between the page buffer 14 and an external device (e.g., a memory controller). The column decoder 16 may decode an address signal inputted from the external device to select one of the bit lines. The column decoder 16 may be connected in common to the plurality of memory blocks BLK0 to BLKn and may provide data signals to the bit lines of one of the memory blocks BLK0 to BLKn selected in response to the block selection signal.

The control circuit 18 may control overall operations of the memory device (e.g., a non-volatile memory device). The control circuit 18 may receive control signals and an external voltage and may be operated in response to the received signals. The control circuit 18 may include a voltage generator that generates voltages (e.g., a program voltage, a read voltage, and an erasing voltage) necessary to internal operations by means of the external voltage. The control circuit 18 may control read, write, and/or erase operations in response to the control signals.

Figure 2:
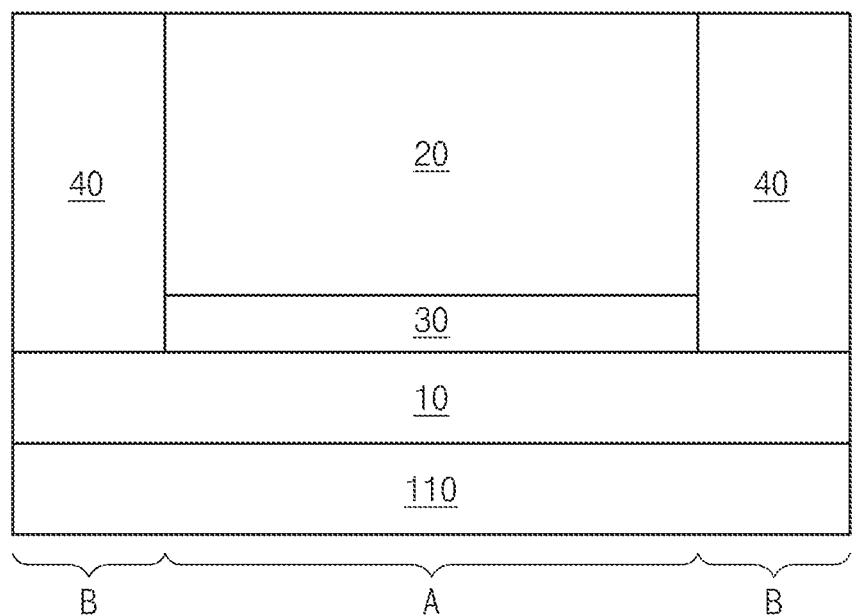
FIG. 2 is a schematic diagram of an example of a cross section of semiconductor devices according to the inventive concepts.

An example of the arrangement of basic structures of semiconductor devices according to the inventive concepts will now be describe with reference to FIG. 2.

A semiconductor device according to the inventive concepts may include a logic section (which may be referred to as a "structure") 10 disposed on a semiconductor substrate 110, a memory section (which may be referred to as a "structure") 20 disposed on the logic section 10, and a stress relaxation section (which may be referred to as a "structure") 30 interposed between the logic structure 10 and the memory structure 20. The logic structure 10 may correspond to the control logic 10 of FIG. 1, and the memory structure 20 may correspond to the memory cell array 20 of FIG. 1.

The semiconductor device may include a circuit region A and a connection region B disposed beside the circuit region A. The logic structure 10 and the memory structure 20 may be disposed on the semiconductor substrate 110 in the circuit region A. The logic structure 10 may extend onto the semiconductor substrate 110 in the connection region B. A connection section (which may be referred to as a "structure") 40 may be disposed on the logic structure 10 in the connection region B.

Figure 3:
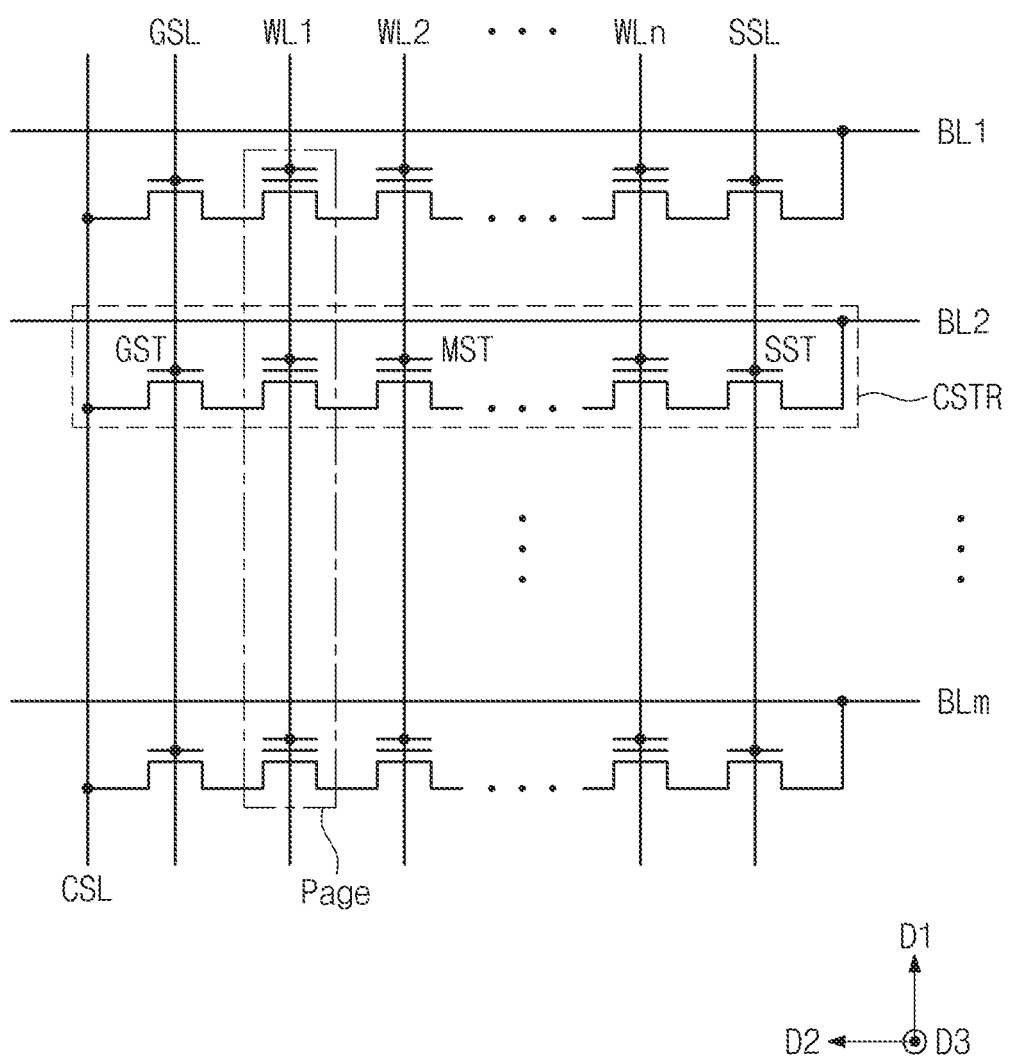
FIG. 3 is a circuit diagram of an example of a memory structure of semiconductor devices according to the inventive concepts.

FIG. 3 illustrates one example of a circuit equivalent to that of a memory structure of embodiments of semiconductor devices according to the inventive concepts.

Referring to FIG. 3, a memory structure 20 of semiconductor devices according to the inventive concepts may have a two-dimensional (2D) NAND flash memory cell array. More specifically, the memory structure 20 may include a plurality of memory cell strings CSTR. Each of the memory cell strings CSTR may include a string selection transistor SST connected to a string selection line SSL, memory cell transistors MCT respectively connected to a plurality of word lines WL1 to WLn, and a ground selection transistor GST connected to a ground selection line GSL. The string selection transistor SST may be connected to a respective one of bit lines BL1 to BLm, and the ground selection transistor GST may be connected to a common source line CSL. The common source line CSL may receive a ground voltage or a CSL voltage (e.g., a power voltage) from a CSL driver (not shown). The word lines WL1 to WLn and the ground selection line GSL may extend in a first direction D1. The bit lines BL1 to BLm may extend in a second direction D2 intersecting the first direction D1. The string selection line SSL, the word lines WL1 to WLn, and the ground selection line GSL may be disposed at the same level relative to the semiconductor substrate 110 of FIG. 2.

Each group of memory cell transistors MCT connected to a respective of the word lines WL1 to WLn may be defined as a page. Each of the memory cell transistors MCT may store one bit data.

Embodiments of semiconductor devices according to the inventive concepts may have a plurality of the 2D NAND flash memory cell arrays described above. In this case, the 2D NAND flash memory cell arrays are stacked in a third direction D3 orthogonal to the first and second directions D1 and D2 (i.e., in a direction perpendicular to a top surface of the semiconductor substrate 110 of FIG. 2).

Figure 4:
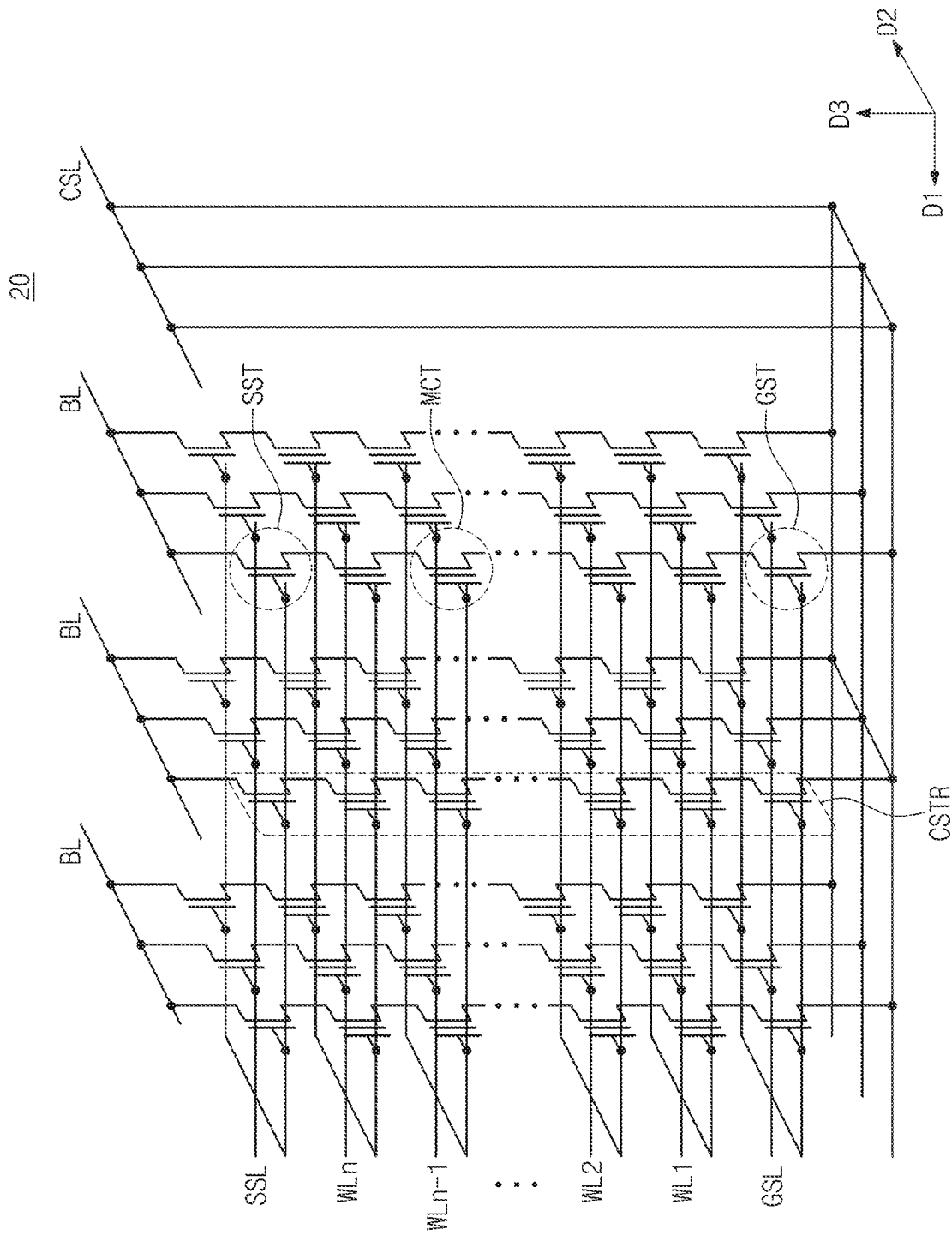
FIG. 4 is a circuit diagram illustrating another example of a memory structure of semiconductor devices according to the inventive concepts.

FIG. 4 illustrates another example of a circuit equivalent to that of a memory structure of embodiments of semiconductor devices according to the inventive concepts.

Referring to FIG. 4, semiconductor devices according to the inventive concepts may include a common source line CSL, bit lines BL, and a plurality of cell strings CSTR interposed between the common source line CSL and the bit lines BL. A plurality of respective ones of the cell strings CSTR may be connected to each of the bit lines BL with the cell strings CSTR disposed in parallel.

Each of the cell strings CSTR may include a ground selection transistor GST connected to the common source line CSL, a string selection transistor SST connected to one of the bit lines BL, and a plurality of memory cell transistors MCT interposed between the selection transistors GST and SST. The ground selection transistor GST, the memory cell transistors MCT, and the string selection transistor SST may be connected in series in the foregoing order. A ground selection line GSL, a plurality of word lines WL1 to WLn and a string selection line SSL may constitute gate electrodes of the ground selection transistor GST, the memory cell transistors MCT and the string selection transistor SST, respectively. Semiconductor devices according to the inventive concepts and configured this was may thus have a three-dimensional (3D) NAND flash memory cell array.

Figure 5:
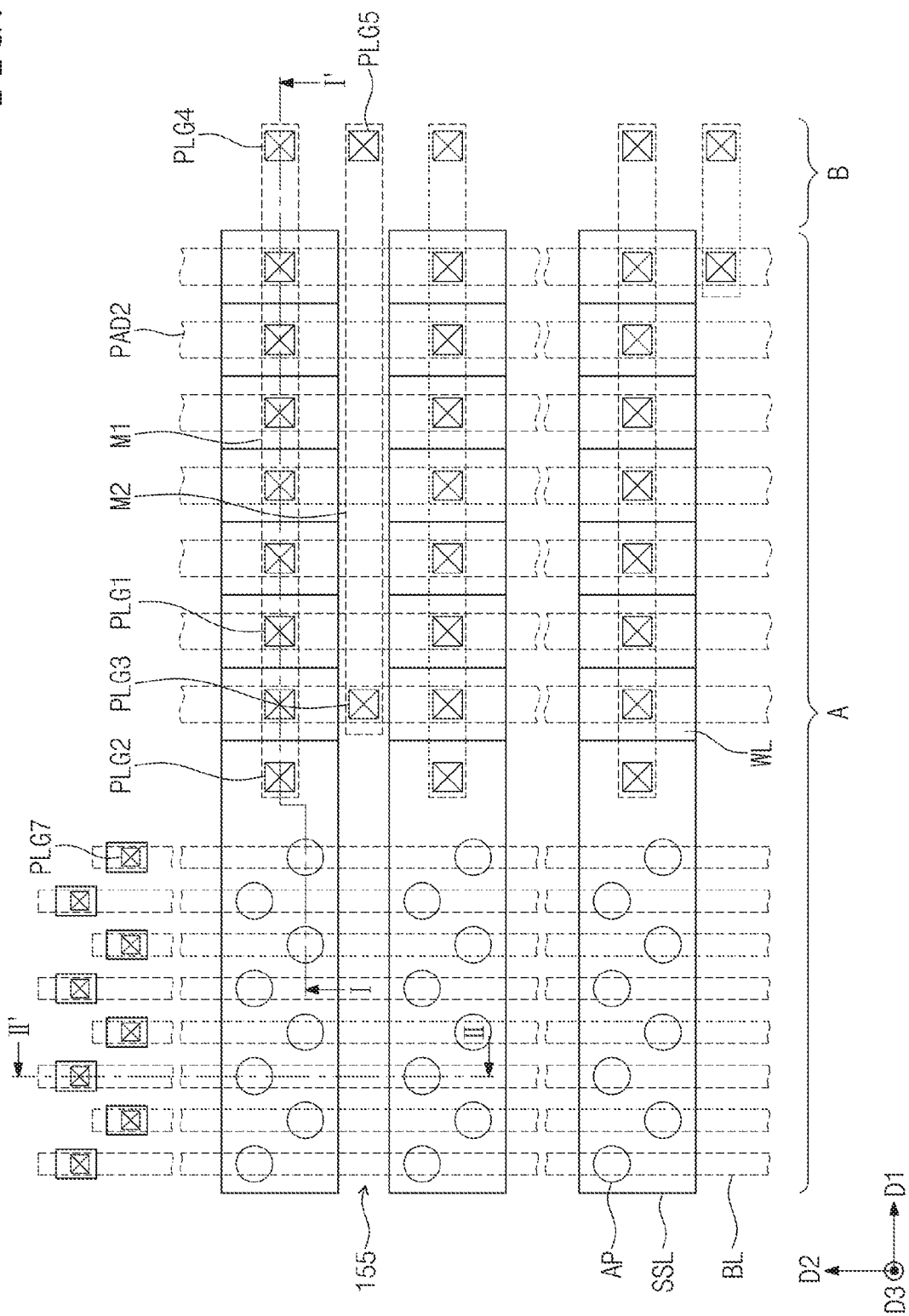
FIG. 5 is a plan view exemplifying the layout of certain features of embodiments of semiconductor devices according to the inventive concepts.

FIG. 5 shows a layout of various elements and features of semiconductor devices according to the inventive concepts.

One embodiment of a semiconductor device having the layout shown in FIG. 5 will now be described with reference to FIGS. 2, 5, 6A and 6B.

Similarly to what was shown in and described with reference to FIG. 2, this embodiment includes a semiconductor substrate 110, a logic structure 10 disposed on the semiconductor substrate 110 in the circuit region A, a memory structure 20 also disposed on the semiconductor substrate 110 in the circuit region A, a stress relaxation structure 30 interposed between the memory structure 20 and the semiconductor substrate 110 in the circuit region A, and a connection structure 40 disposed on the logic structure 10 in the connection region B.

The logic structure 10 may include a logic circuit disposed on the semiconductor substrate 110 in the circuit region A and the connection region B and a lower insulating structure 120 (or "lower insulating layer" for short) covering the logic circuit. The lower insulating layer 120 may include a plurality of silicon oxide layers. The logic circuit may include transistors TR. The transistors TR may be formed on active regions defined by a device isolation layer 112. The transistors TR may be connected to lower interconnections 122 and lower contacts 124, which are disposed in the lower insulating layer 120.

The stress relaxation structure 30 may be disposed on the lower insulating layer 120 in the circuit region A. An intermediate insulating layer 140 may be disposed on the lower insulating layer 120 in the connection region B. The intermediate insulating layer 140 may comprise a silicon oxide layer.

The stress relaxation structure 30 may include an air gap 130 and at least one support 132 disposed in the air gap 130. The support 132 may include at least one of silicon oxide, silicon nitride, silicon oxynitride, poly-crystalline silicon, and a metal. The thickness of the stress relaxation structure 30 may be about 1000 Å. A capping structure 135 (referred to hereinafter as a "capping layer" for short) may be disposed on the stress relaxation structure 30 and the intermediate insulating layer 140. The capping layer 135 may include at least one of a silicon oxide layer and a porous insulating layer. The support 132 supports the capping layer 135 above the air gap 130.

The memory structure 20 may be disposed on the capping layer 135 in the circuit region A. The memory structure 20 may include a semiconductor layer structure 150 (or "semiconductor layer" for short), a stack ST on the semiconductor layer 150, and a plurality of vertical pillars AP penetrating the stack ST.

The semiconductor layer 150 is not disposed in the connection region B. In other words, the semiconductor layer 150 does not extend over the capping layer 135 in the connection region B. The semiconductor layer 150 may include at least one of a single-crystalline silicon layer, a silicon-on-insulator (SOI), a silicon layer formed on a silicon-germanium (SiGe) layer, a single-crystalline silicon layer formed on an insulating layer, and a poly-crystalline silicon layer formed on an insulating layer. The semiconductor layer 150 may have a first conductivity type (e.g., a P-type). A buffer dielectric layer 162 may be interposed between the semiconductor layer 150 and the stack ST. The buffer dielectric layer 162 may be a silicon oxide layer.

Figure 6A:
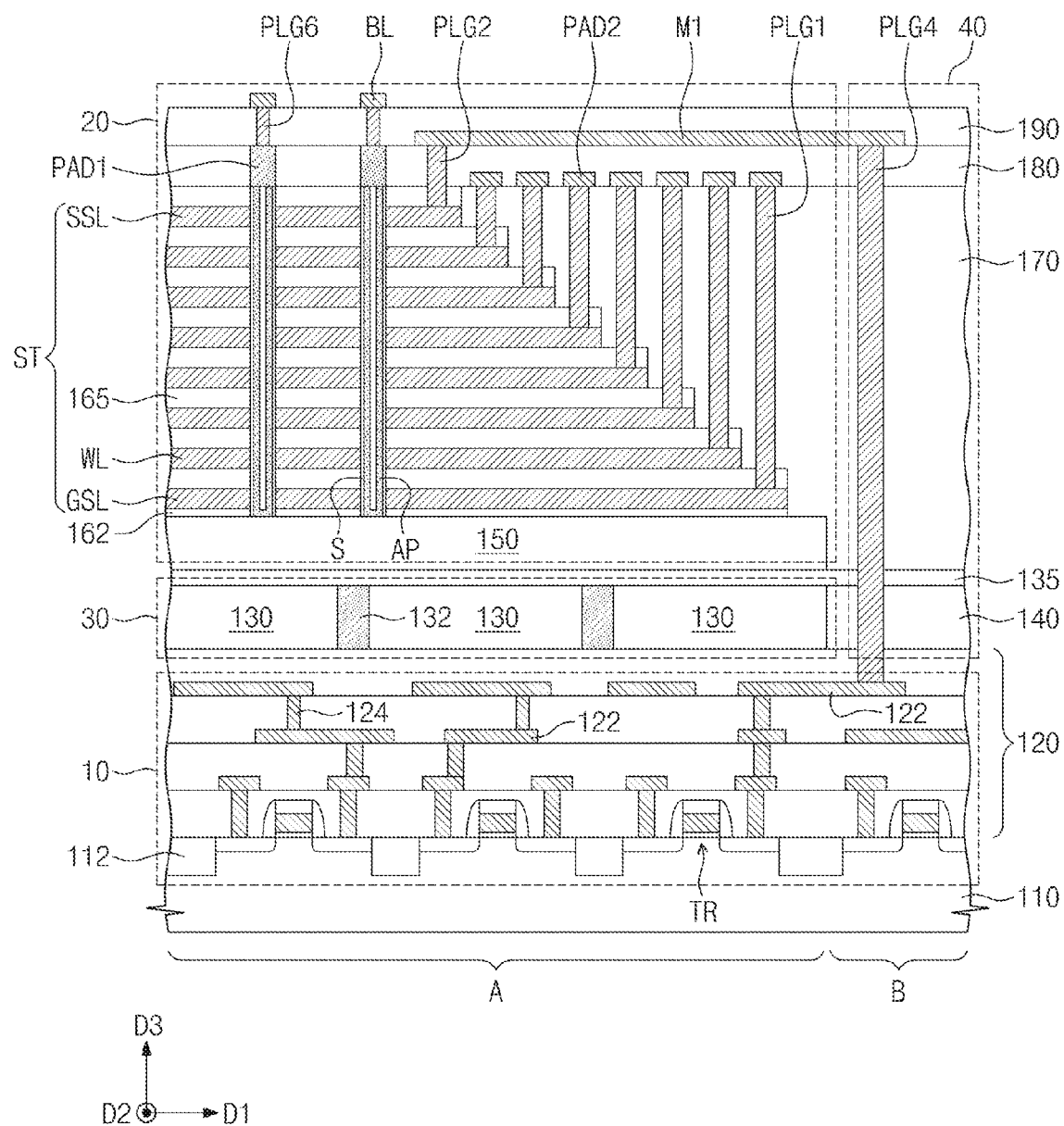
FIGS. 6A and 6B are cross-sectional views of one embodiment of a semiconductor device, according to the inventive concepts, taken along lines I-I' and II-II' of FIG. 5, respectively.
Figure 6B:
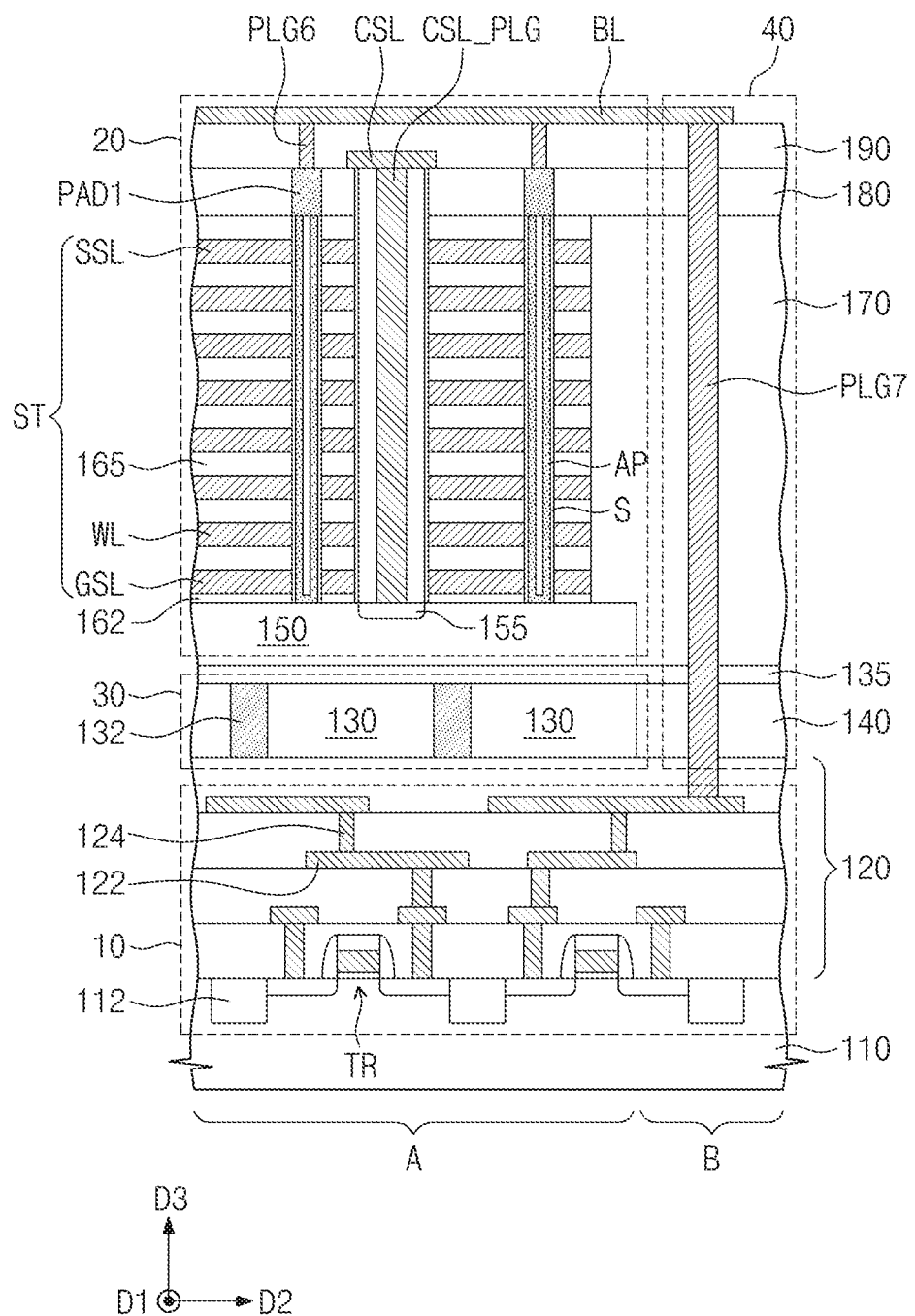

The stack ST may include insulating patterns 165 and electrodes disposed between the insulating patterns 165. The electrodes may constitute a ground selection line GSL, word lines WL, and a string selection line SSL which are sequentially stacked on the semiconductor layer 150. The electrodes GSL, WL, and SSL may constitute a series of steps adjacent to the connection region B. The insulating patterns 165 may comprise silicon oxide. The electrodes GSL, WL, and SSL may comprise at least one of silicon, a metal (e.g., tungsten), a metal nitride, and a metal silicide. Six sequentially stacked word lines WL are illustrated in FIGS. 5, 6A, and 6B. However, the inventive concepts are not limited thereto. That is, the number of the stacked word lines WL may be less than or greater than 6.

The stack ST may extend in a first direction D1. A plurality of stacks ST may be spaced apart from each other in a second direction D2 intersecting (e.g., perpendicular to) the first direction D1. A common source region 155 may be provided in the semiconductor layer 150 between the stacks ST. The common source region 155 may extend in the first direction D1. The common source region 155 may have a second conductivity type (e.g., an N-type). A strapping plug CSL_PLG may be disposed between the stacks ST and connected to the common source region 155.

First ends (e.g., bottom ends) of the vertical pillars AP may be connected to the semiconductor layer 150. Each of the vertical pillars AP may include a semiconductor pattern. The semiconductor pattern may comprise silicon or silicon-germanium which is doped with ions of the first conductivity type. Each of the vertical pillars AP may have a hollow cylindrical shape. Thus, each of the vertical pillars AP may have an inner hole. The inner holes of each of the vertical pillars AP may be filled with a filling insulation layer. The filling insulation layer may be silicon oxide.

The memory structure 20 may further include a data storage section S disposed between the vertical pillar AP and the electrodes GSL, WL, and SSL. The data storage section S may include a blocking insulator (referred to as a "blocking insulating layer") adjacent to the electrodes GSL, WL and SSL, a tunnel insulating layer adjacent to the vertical pillar AP, and a charge storage layer disposed between the blocking insulating layer and the tunnel insulating layer.

The blocking insulating layer may comprise a hafnium oxide layer, an aluminum oxide layer and/or a silicon oxide layer. In these cases the hafnium oxide layer, the aluminum oxide layer and the silicon oxide layer may have various arrangements relative to one another. The tunnel insulating layer may be a silicon oxide layer. The charge storage layer may be a charge trap layer or an insulating layer including conductive nano-particles. The charge trap layer may be, for example, a silicon nitride layer.

A first upper insulating layer 170 may be disposed on the memory structure 20 and the intermediate insulating layer 140. The first upper insulating layer 170 may expose the stack ST. First plugs PLG1 may extend through the first upper insulating layer 170 and the insulating patterns 165 to be connected to the ground selection line GSL and the word lines WL, respectively. A second plug PLG2 may be disposed on the stack ST and connected to the string selection line SSL. First pads PAD1 may be disposed on second ends (e.g., top ends) of the vertical pillars AP, respectively. Second pads PAD2 may be disposed on the first plugs PLG1, respectively. A common source line CSL may be disposed on the stack ST and connected to the strapping plug CSL_PLG. The common source line CSL may extend in the first direction D1.

A second upper insulating layer 180 may be disposed on the stack ST and the first upper insulating layer 170. The second upper insulating layer 180 may cover the first pads PAD1 and the second pads PAD2. A first upper interconnection M1 and a second upper interconnection M2 may be disposed on the second upper insulating layer 180. The first upper interconnection M1 may be connected to the string selection line SSL through the second plug PLG2 and may be connected to the logic circuit of the logic structure 10 through a fourth plug PLG4. The second upper interconnection M2 may be connected to each of the ground selection and word lines GSL and WL through a third plug PLG5 and may be connected to the logic circuit of the logic structure 10 through a fifth plug PLG5. The fourth and fifth plugs PLG4 and PLG5 may be disposed in the connection region B and may extend through the second and first upper insulating layers 180 and 170, the capping layer 135, the intermediate insulating layer 140, and the lower insulating layer 120.

A third upper insulating layer 190 may be disposed on the second upper insulating layer 180. Bit lines BL may be disposed on the third upper insulating layer 190. Each of the bit lines BL may be connected to the vertical pillars AP through sixth plugs PLG6 and the first pads PAD1. In addition, each of the bit lines BL may be connected to the logic circuit of the logic structure 10 through a seventh plug PLG7. The seventh plug PLG7 may be disposed in the connection region B and may extend through the third to first upper insulating layers 190, 180, and 170, the capping layer 135, the intermediate insulating layer 140, and the lower insulating layer 120.

Each of the first to third upper insulating layers 170, 180, and 190 may be a silicon oxide layer. A connection structure 40 may include the fourth, fifth, and seventh plugs PLG4, PLG5, and PLG7. The connection structure 40 may further include the first plugs PLG1.

The stress relaxation structure 30 relieves stress created by the memory structure 20 (e.g., the stack ST). The stress relaxation structure 30 may also relieve stress created by the connection structure 40 in addition to the stress created by the memory structure 20. Thus, it is possible to mitigate a deterioration of certain characteristics of the logic structure 10.

Figure 7A:
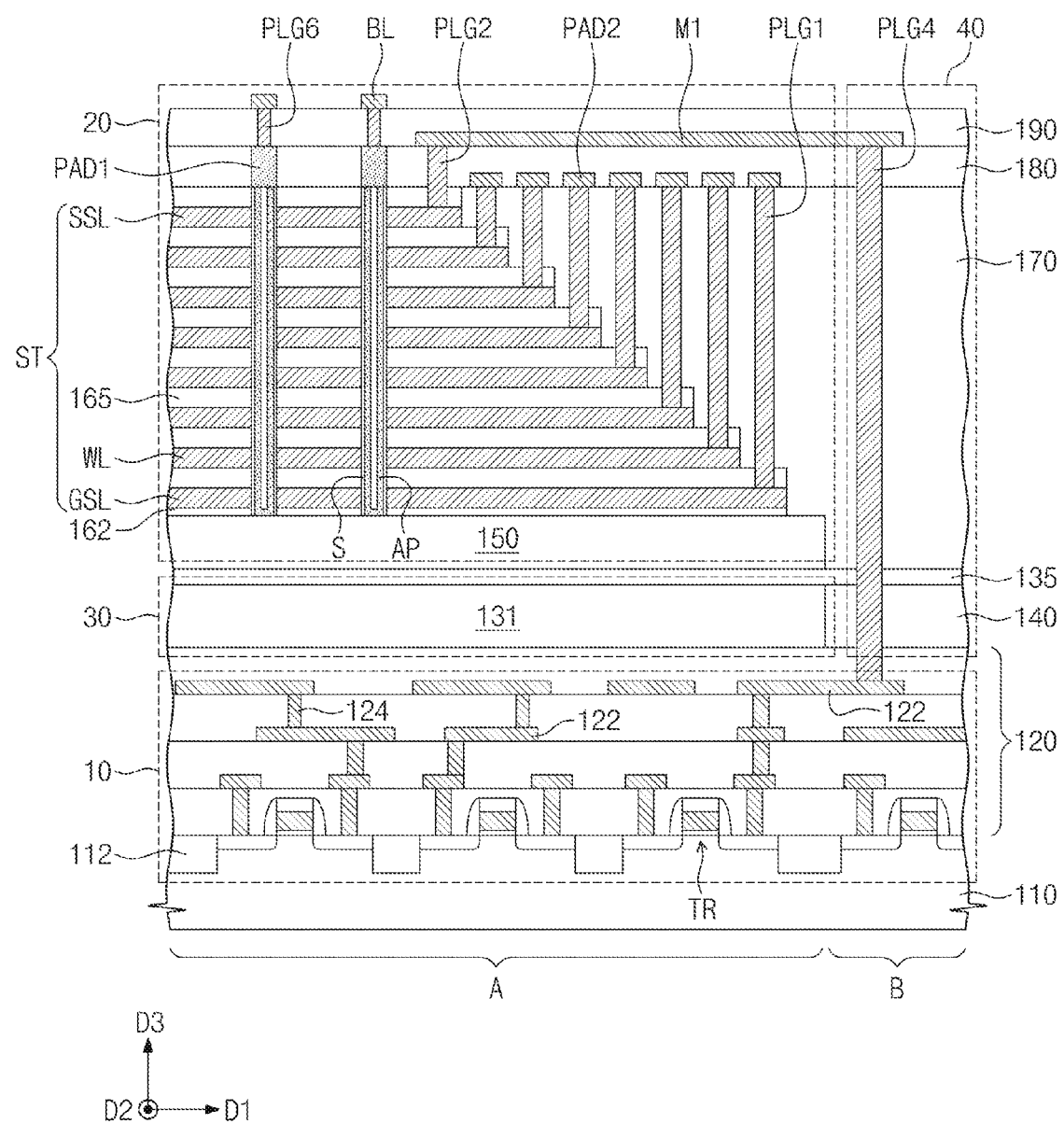
FIGS. 7A and 7B are cross-sectional views of another embodiment of a semiconductor device according to the inventive concepts, taken along lines I-I' and II-II' of FIG. 5, respectively.
Figure 7B:
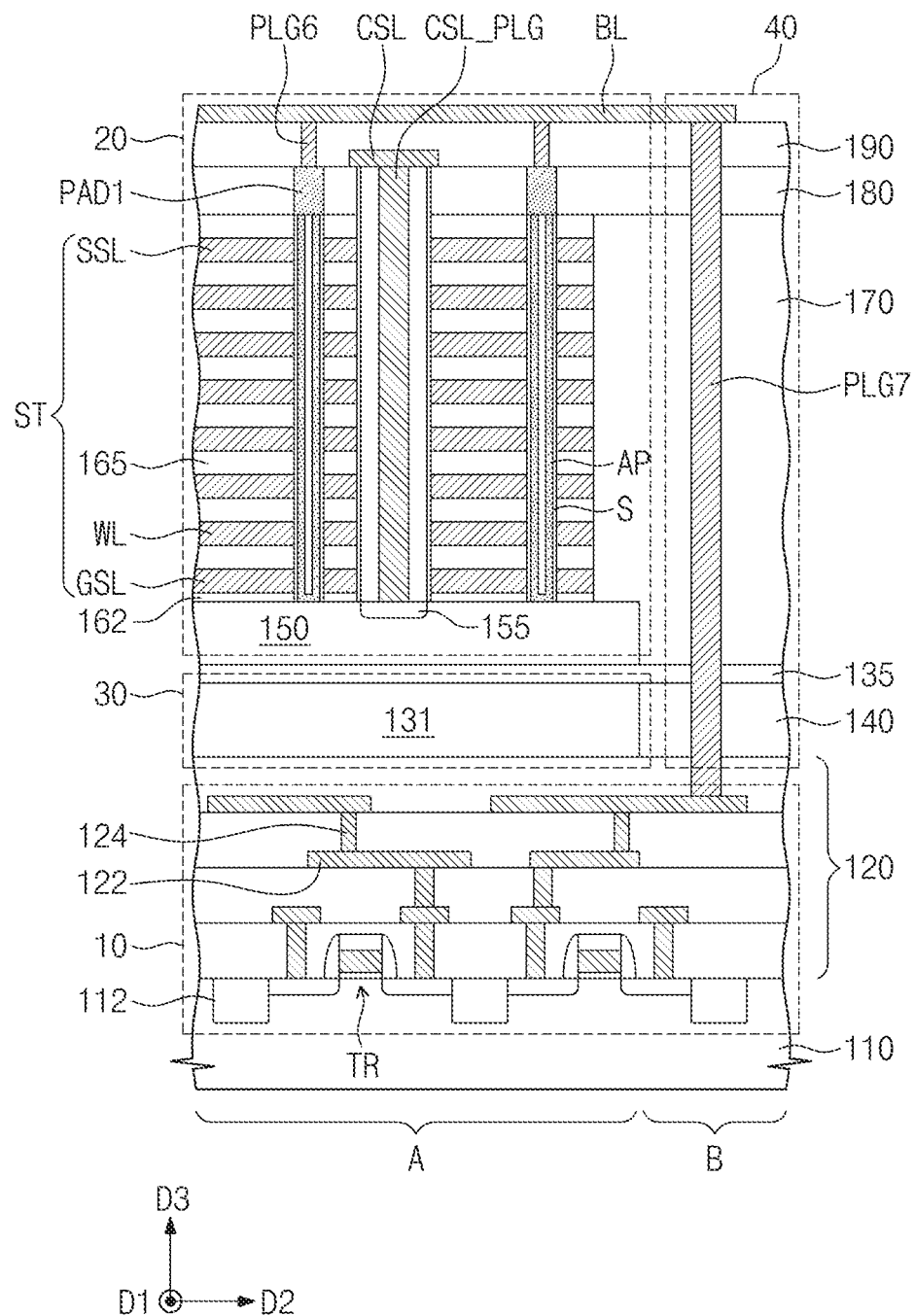

FIGS. 7A and 7B illustrate another embodiment of a semiconductor device according to the inventive concepts. For the sake of brevity, elements and features of this embodiment that are similar to those described above in connection with the embodiment of FIGS. 6A and 6B will not be described again in detail or will only be referred to briefly.

Referring to FIGS. 5, 7A, and 7B, stress relaxation structure 30 is a solid structure having intrinsic stress. The stress relaxation structure 30 may comprise material 131 having tensile stress. For example, the stress relaxation structure 30 may comprise an insulating layer having a dielectric constant lower than that of silicon oxide. The stress relaxation structure 30 may comprise a porous material. If the memory structure 20 (e.g., the stack ST) has tensile stress, the stress relaxation structure 30 can relieve the tensile stress created by the memory structure 20. Alternatively, the stress relaxation structure 30 may comprise material 131 having compressive stress. For example, the stress relaxation structure 30 may comprise a silicon nitride layer or a silicon oxynitride layer.

As with the previously described embodiment, the stress relaxation structure 30 relieves stress created by the memory structure 20, especially the stack ST. The stress relaxation structure 30 may also relieve stress created by the connection structure 40 in addition to the stress created by the memory structure 20. Thus, it is possible to mitigate a deterioration of certain characteristics of the logic structure 10.

A method of manufacturing semiconductor devices, having the layout shown in FIG. 5, according to the inventive concept will be described hereinafter with reference to FIGS. 8A to 15B.

Figure 8A:
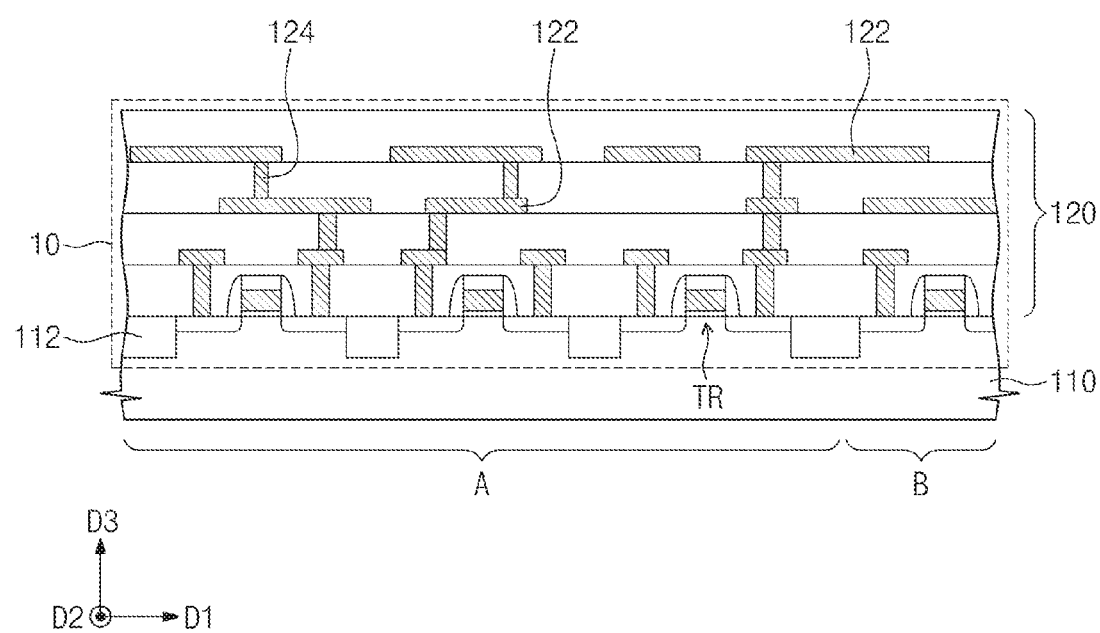
Figure 8B:
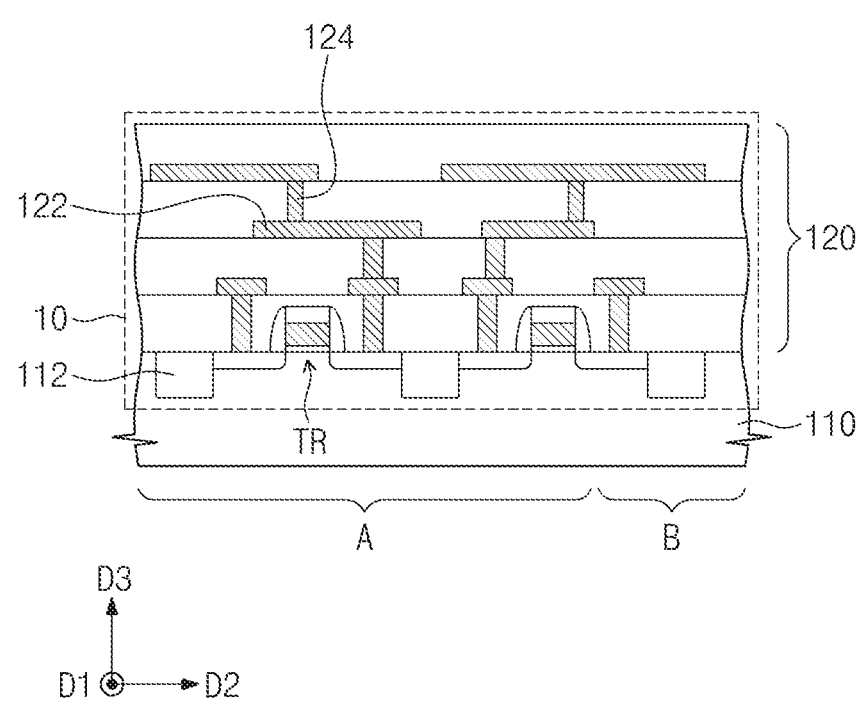

Referring to FIGS. 8A and 8B, a semiconductor substrate 110 may be provided. The semiconductor substrate 110 may be a semiconductor substrate having a first conductivity type (e.g., a P-type). The semiconductor substrate 110 may comprise at least one of a single-crystalline silicon layer, a silicon-on-insulator (SOI), a silicon layer formed on a silicon-germanium (SiGe) layer, a single-crystalline silicon layer formed on an insulating layer, and a poly-crystalline silicon layer formed on an insulating layer.

A logic structure 10 may be formed on the semiconductor substrate 110. The logic structure 10 may include a logic circuit formed on the semiconductor substrate 110 in what will be a circuit region A of the device and a connection region B of the device beside the circuit region A. The logic circuit may include transistors TR. The transistors TR may be formed on active regions defined by a device isolation layer 112. A lower insulating layer 120 may be formed on the semiconductor substrate 110 to cover the transistors TR. The lower insulating layer 120 may include a plurality of silicon oxide layers. The transistors TR may be connected to lower interconnections 122 and lower contacts 124, which are formed in the lower insulating layer 120.

Figure 9A:
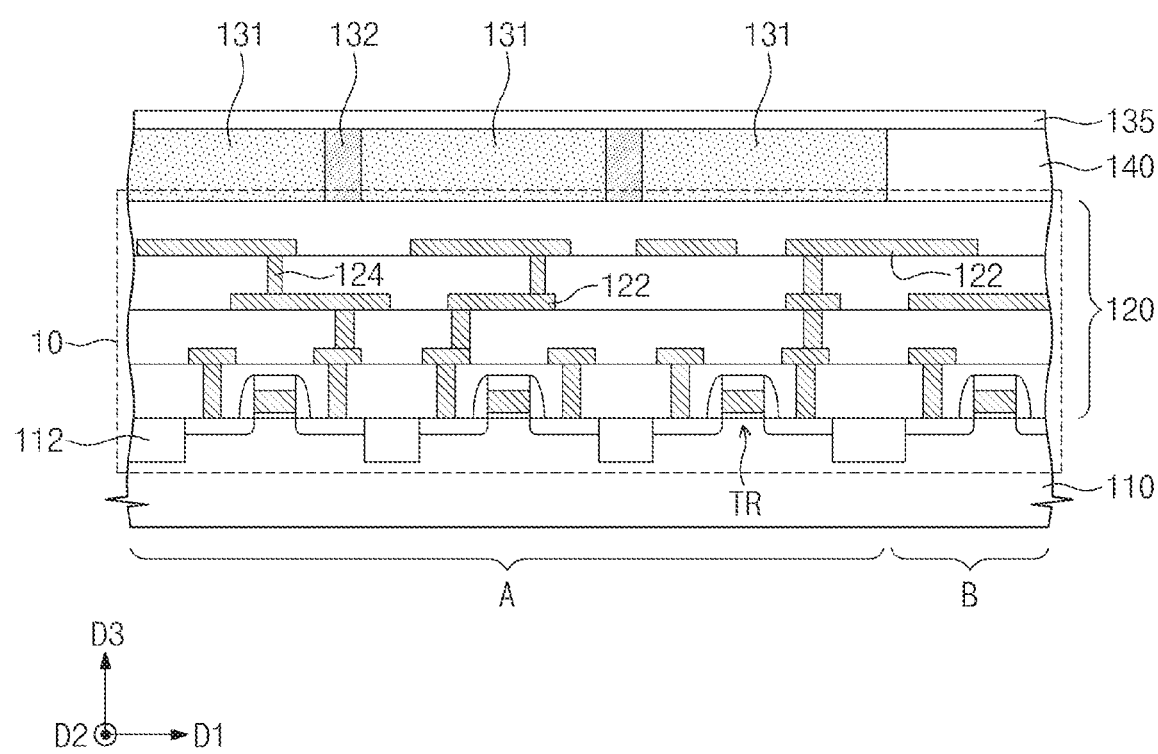
Figure 9B:
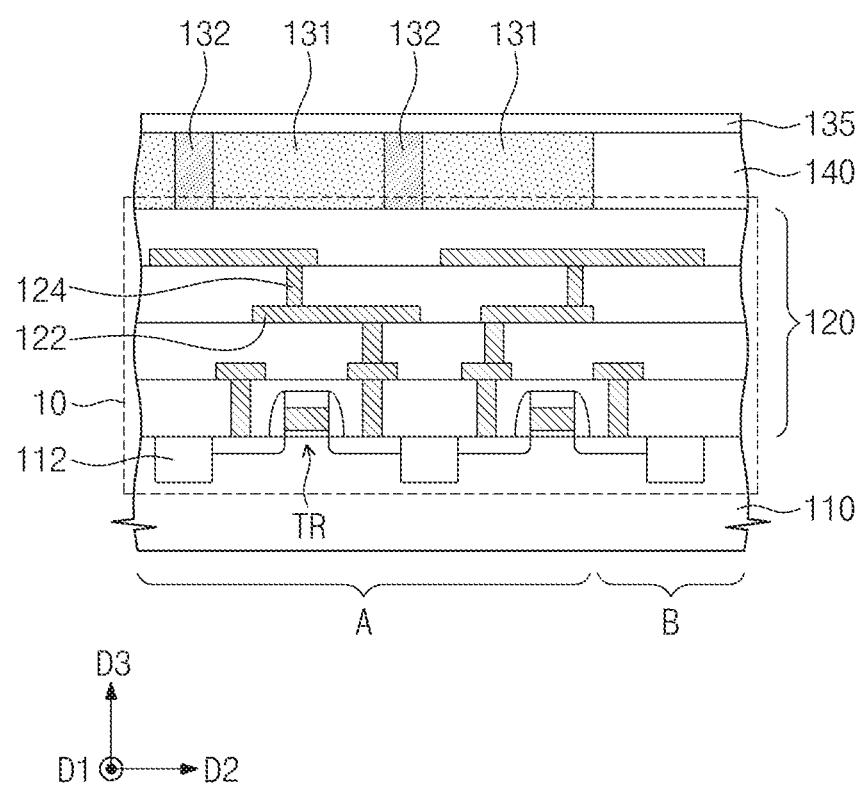

Referring to FIGS. 9A and 9B, a first sacrificial layer 131 may be formed on the lower insulating layer 120 in the circuit region A. The first sacrificial layer 131 may be, but is not limited to, a spin-on-hardmask (SOH) layer. The SOH layer may include a hydrocarbon-based insulating layer. Alternatively, the first sacrificial layer 131 may be a photoresist layer. A thickness of the first sacrificial layer 131 may be about 1000 Å. Supports 132 may be formed on the lower insulating layer 120. The supports 132 may be formed of at least one of silicon oxide, silicon nitride, silicon oxynitride, poly-crystalline silicon, and a metal. After the supports 132 are formed on the lower insulating layer 120 of the circuit region A, the first sacrificial layer 131 may be formed in a space between the supports 132. A top surface of the first sacrificial layer 131 may be disposed at the same level as top surfaces of the supports 132 by a planarization process.

An intermediate insulating layer 140 may be formed on the lower insulating layer 120 in the connection region B. The intermediate insulating layer 140 may be a silicon oxide layer. A capping layer 135 may be formed on the first sacrificial layer 131 and the intermediate insulating layer 140. The capping layer 135 may be a silicon oxide layer or a porous insulating layer. The porous insulating layer may be a porous SiCOH layer that includes pores of several tens of nm (in average diameter).

Figure 10A:
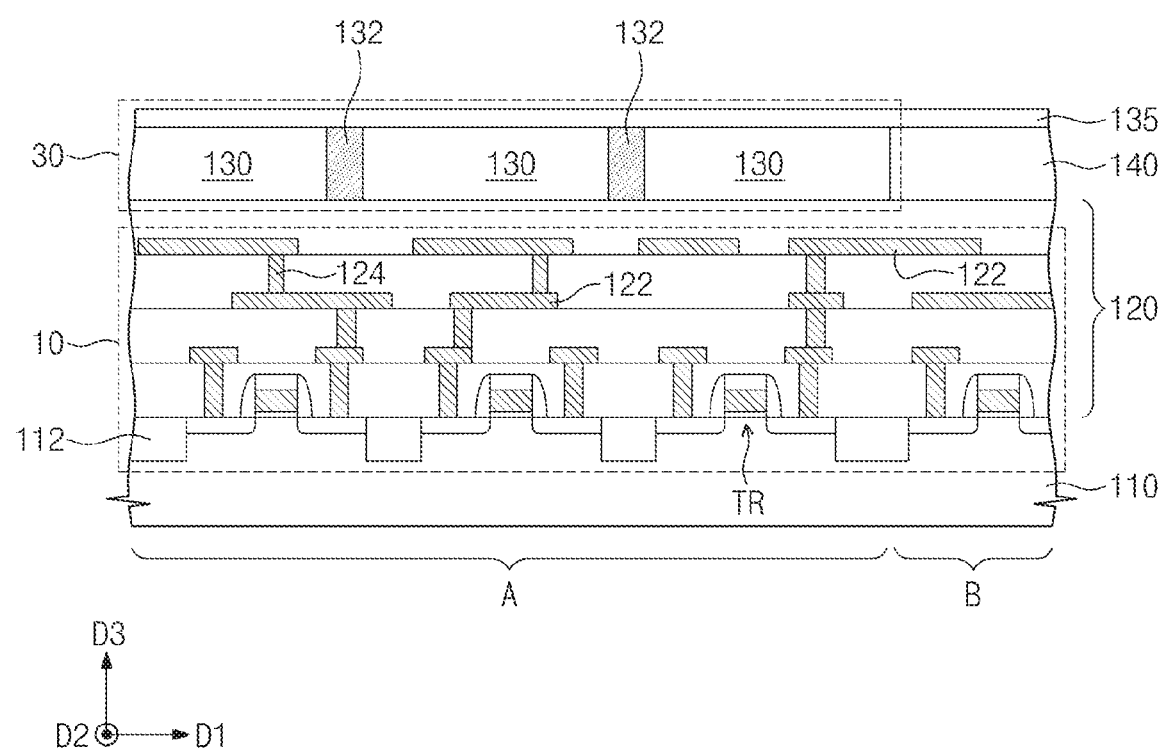
Figure 10B:
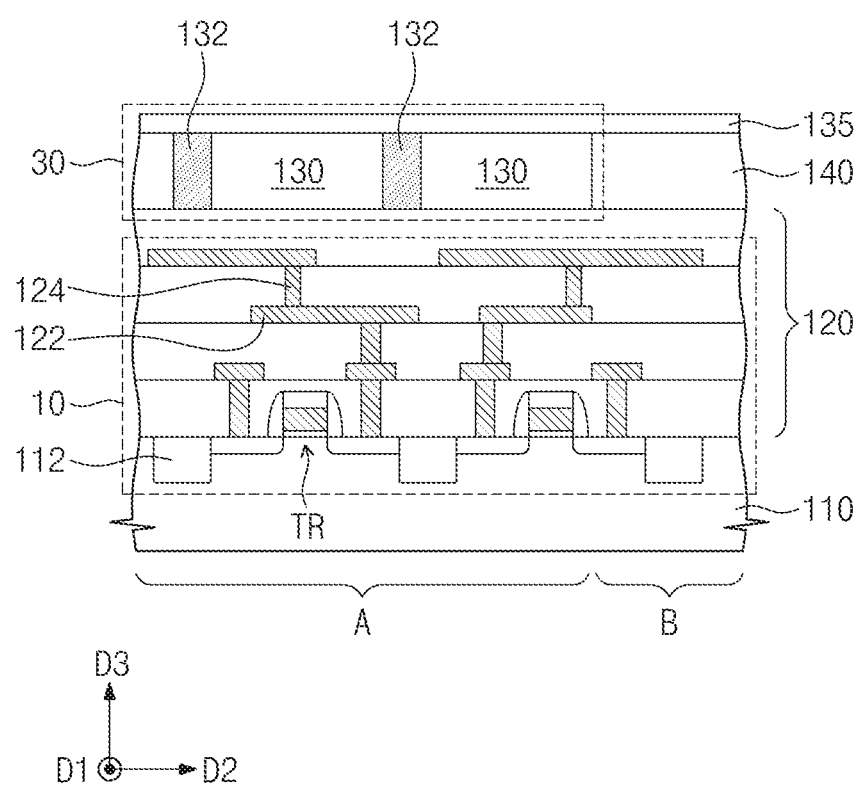

Referring to FIGS. 10A and 10B, the first sacrificial layer 131 may be removed to form an air gap 130. The air gap 130 may be an empty space defined by the lower insulating layer 120, the intermediate insulating layer 140 and the capping layer 135. The removal of the first sacrificial layer 131 may be performed by, for example, an ashing process using oxygen, ozone or ultraviolet (UV), or a wet cleaning process. The supports 132 may remain on the lower insulating layer 120 after the first sacrificial layer 131 has been removed such that the supports 132 also delimit the air gap 130. A memory structure 20 to be formed on the lower insulating layer 120 and substrate 110 may thus be supported by the supports 132. As a result, a stress relaxation structure 30 composed of the air gap 130 and the supports 132 is formed.

Figure 11A:
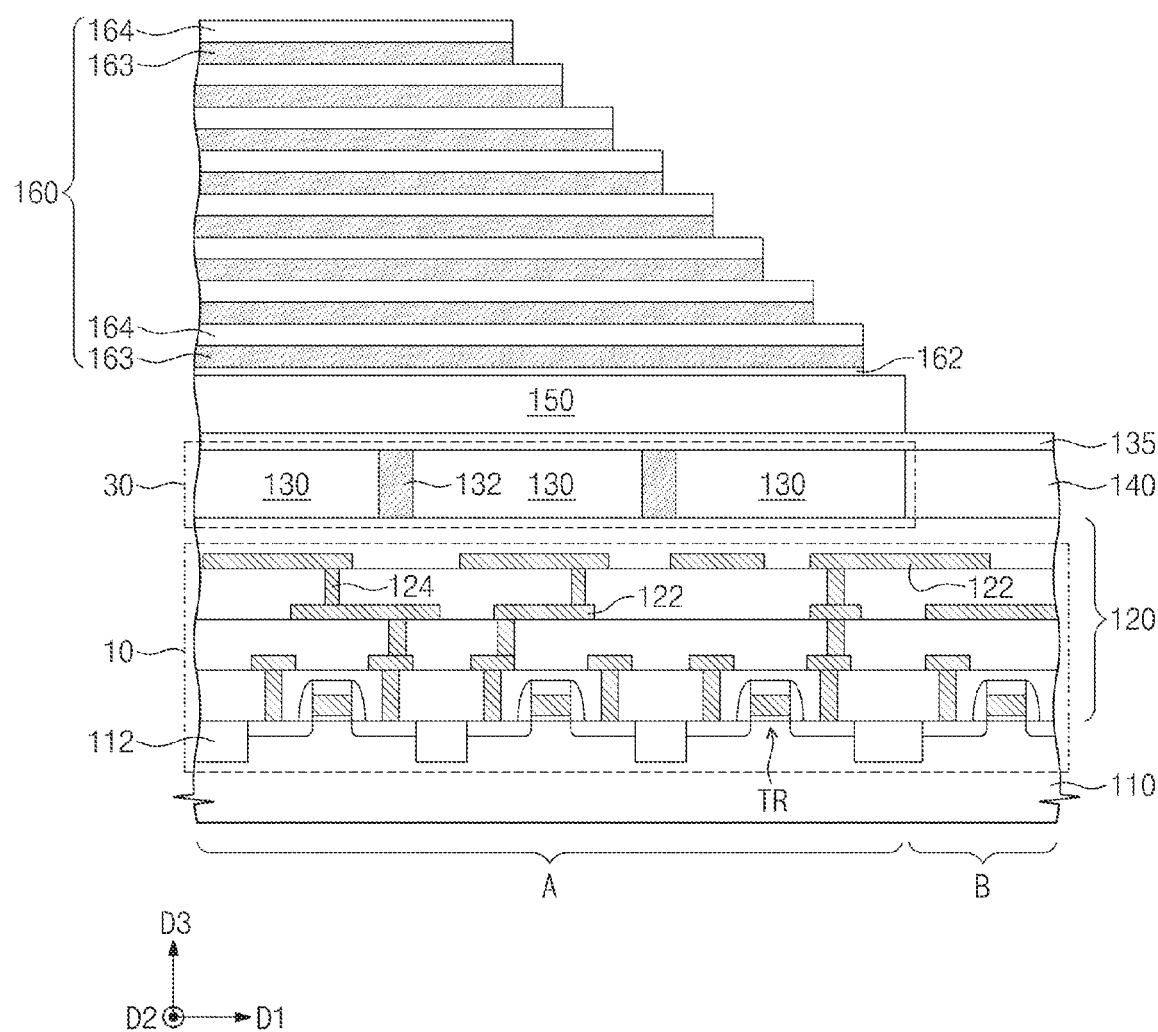
Figure 11B:
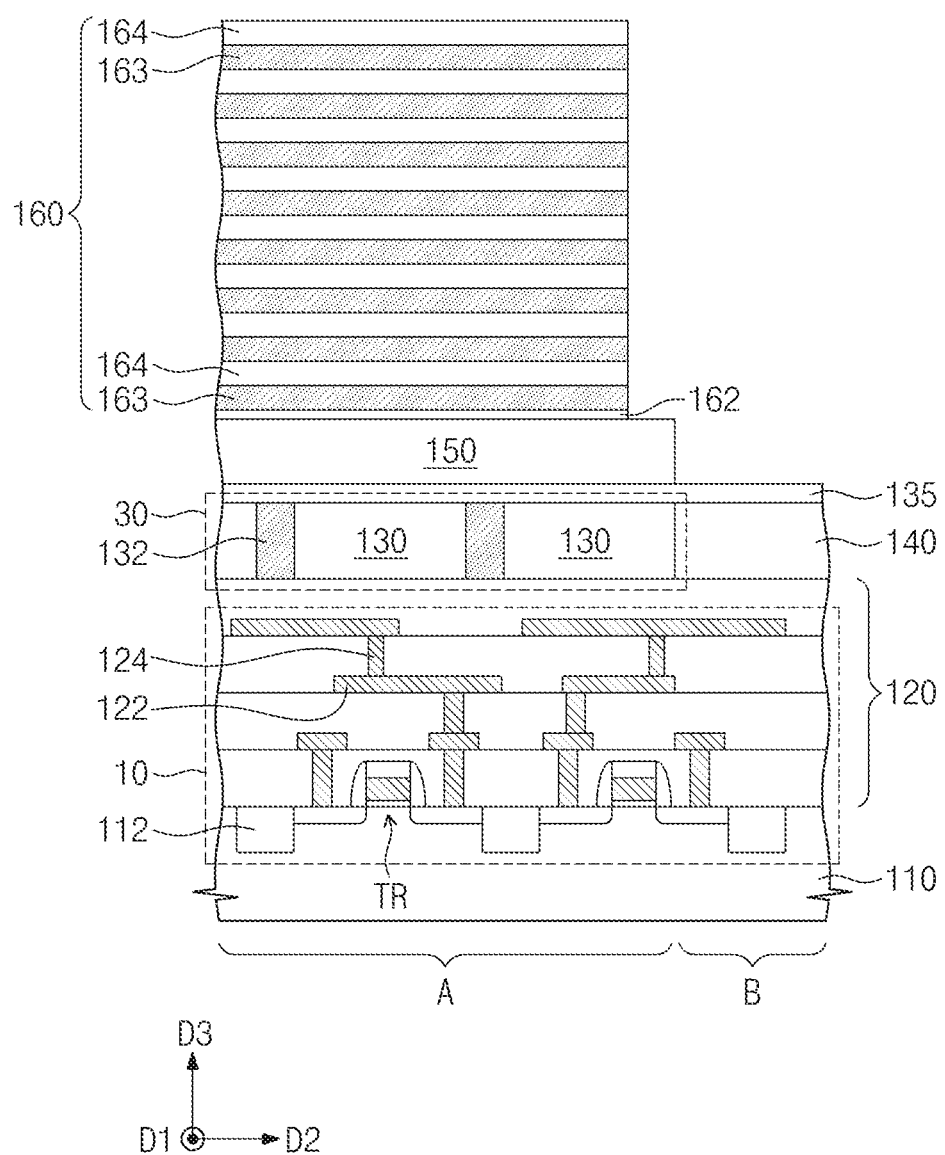

Referring to FIGS. 11A and 11B, a semiconductor layer 150 may be formed on the capping layer 135. The semiconductor layer 150 may include at least one of a single-crystalline silicon layer, a silicon-on-insulator (SOI), a silicon layer formed on a silicon-germanium (SiGe) layer, a single-crystalline silicon layer formed on an insulating layer, and a poly-crystalline silicon layer formed on an insulating layer. The semiconductor layer 150 may have the first conductivity type (e.g., a P-type). The semiconductor layer 150 may be removed from the connection region B by a patterning process. In other words, the semiconductor layer 150 may expose the capping layer 135 in the connection region B.

A buffer dielectric layer 162 may be formed on the semiconductor layer 150. The buffer dielectric layer 162 may be, for example, a silicon oxide layer. The buffer dielectric layer 162 may be formed by a thermal oxidation process. A preliminary stack 160 may be formed on the buffer dielectric layer 162. The preliminary stack 160 may include second sacrificial layers 163 and insulating layers 164 which are alternately stacked on the buffer dielectric layer 162. The insulating layers 164 may be, for example, silicon oxide layers. The second sacrificial layers 163 may comprise material having a wet etch selectivity with respect to the buffer dielectric layer 162 and the insulating layers 164. For example, each of the second sacrificial layers 163 may be a silicon nitride layer, a silicon oxynitride layer, a poly-crystalline silicon layer, or a poly-crystalline silicon-germanium layer. The second sacrificial layers 163 and the insulating layers 164 may be formed by, for example, a chemical vapor deposition (CVD) method. The second sacrificial layers 163 and the insulating layers 164 may be patterned such that the preliminary stack 160 may have a stepped section adjacent to the connection region B. The second sacrificial layers 163 and the insulating layers 164 may expose the capping layer 135 in the connection region B.

Figure 12A:
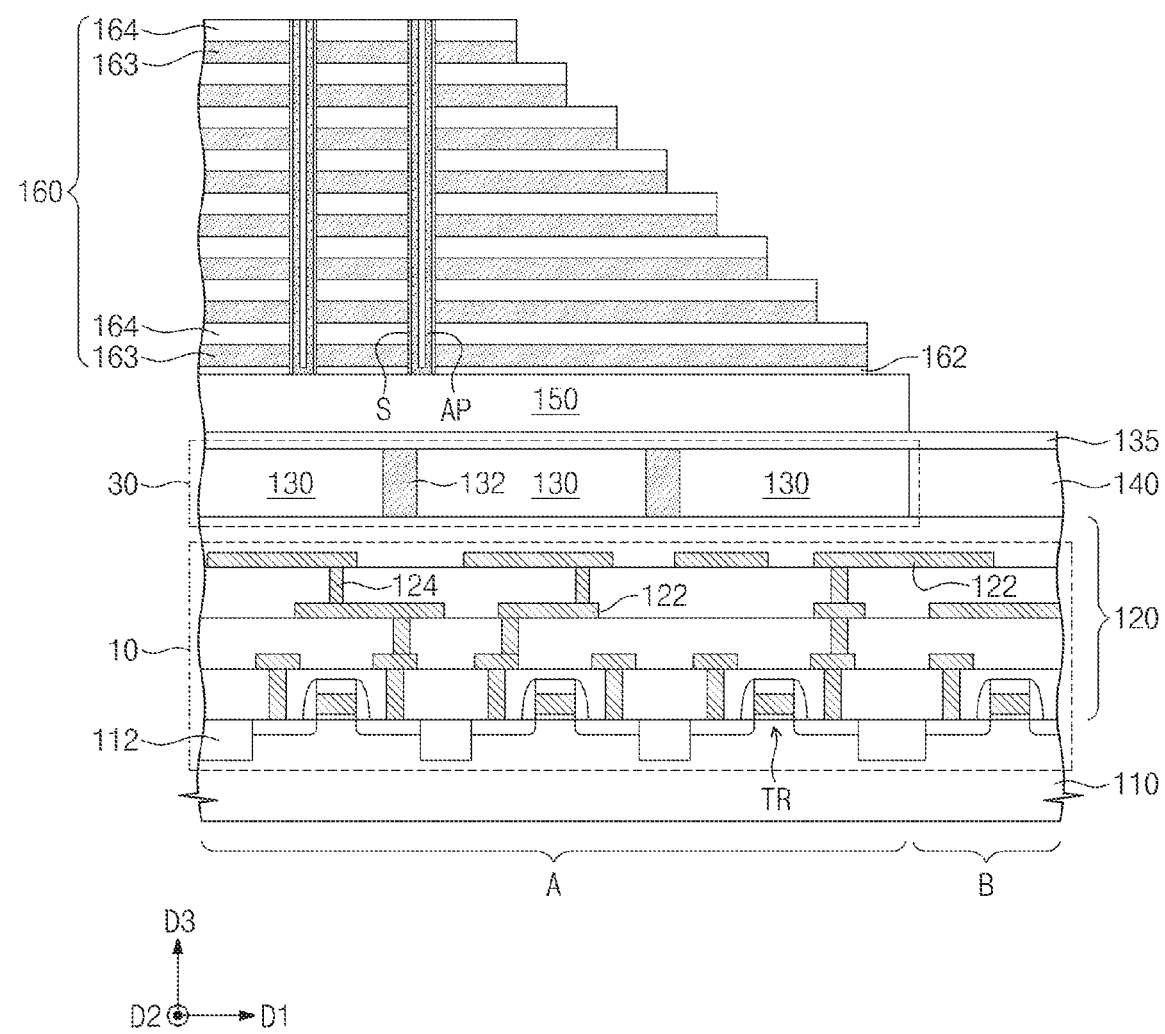
Figure 12B:
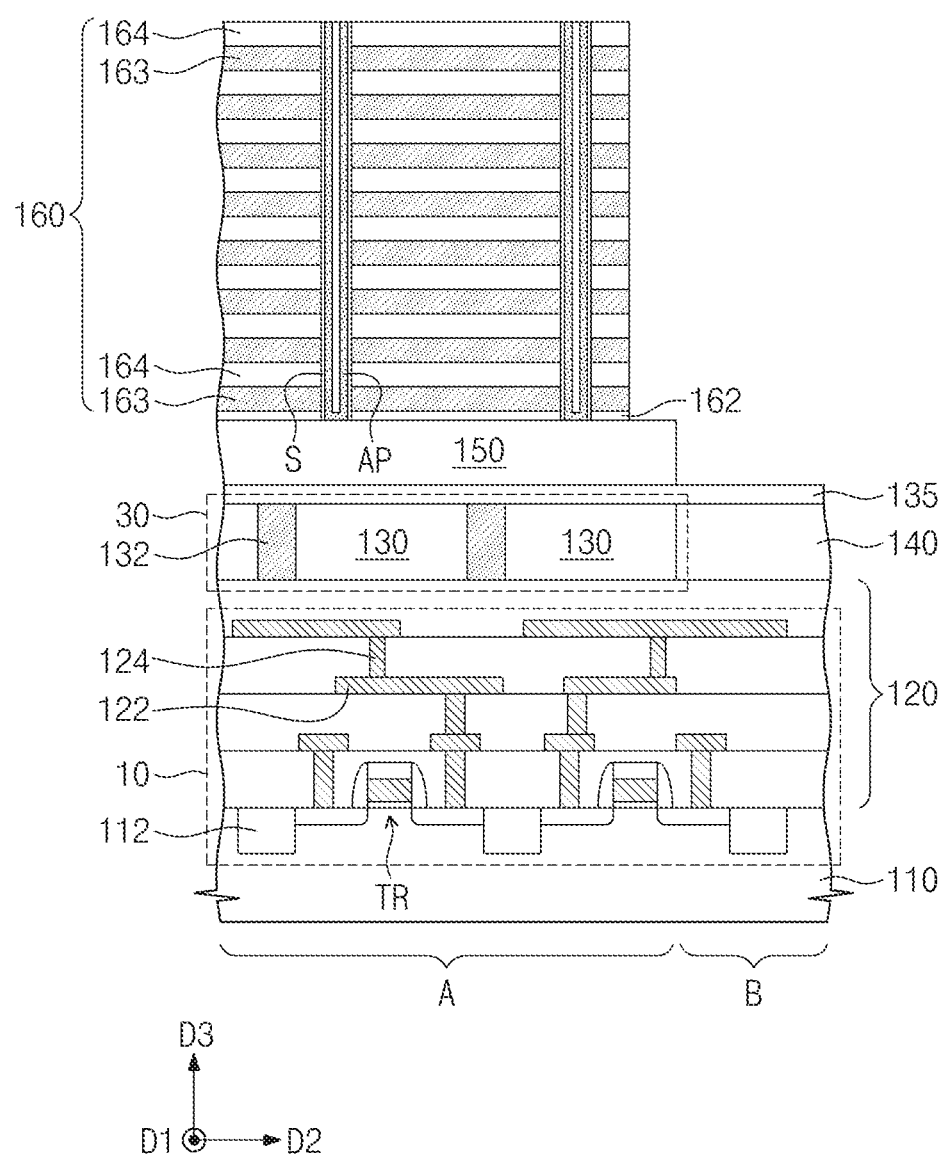

Referring to FIGS. 12A and 12B, vertical holes may be formed through the preliminary stack 160. The vertical holes may expose the semiconductor layer 150. Vertical pillars AP may be formed in the vertical holes, respectively. One-end (e.g., the bottom end) of each of the vertical pillars AP may be connected to the semiconductor layer 150. Each of the vertical pillars AP may comprise a semiconductor pattern. The semiconductor pattern may be of silicon or silicon-germanium doped with ions of the first conductivity type. Data storage sections S may be formed along the sides of the vertical holes before the vertical pillars P are formed so that a data storage section S is located between each of the vertical pillars AP and an interior surface of the preliminary stack 160 delimiting each of the vertical holes. The data storage section S may include a blocking insulating layer, a tunnel insulating layer, and a charge storage layer disposed between the blocking insulating layer and the tunnel insulating layer.

Figure 13A:
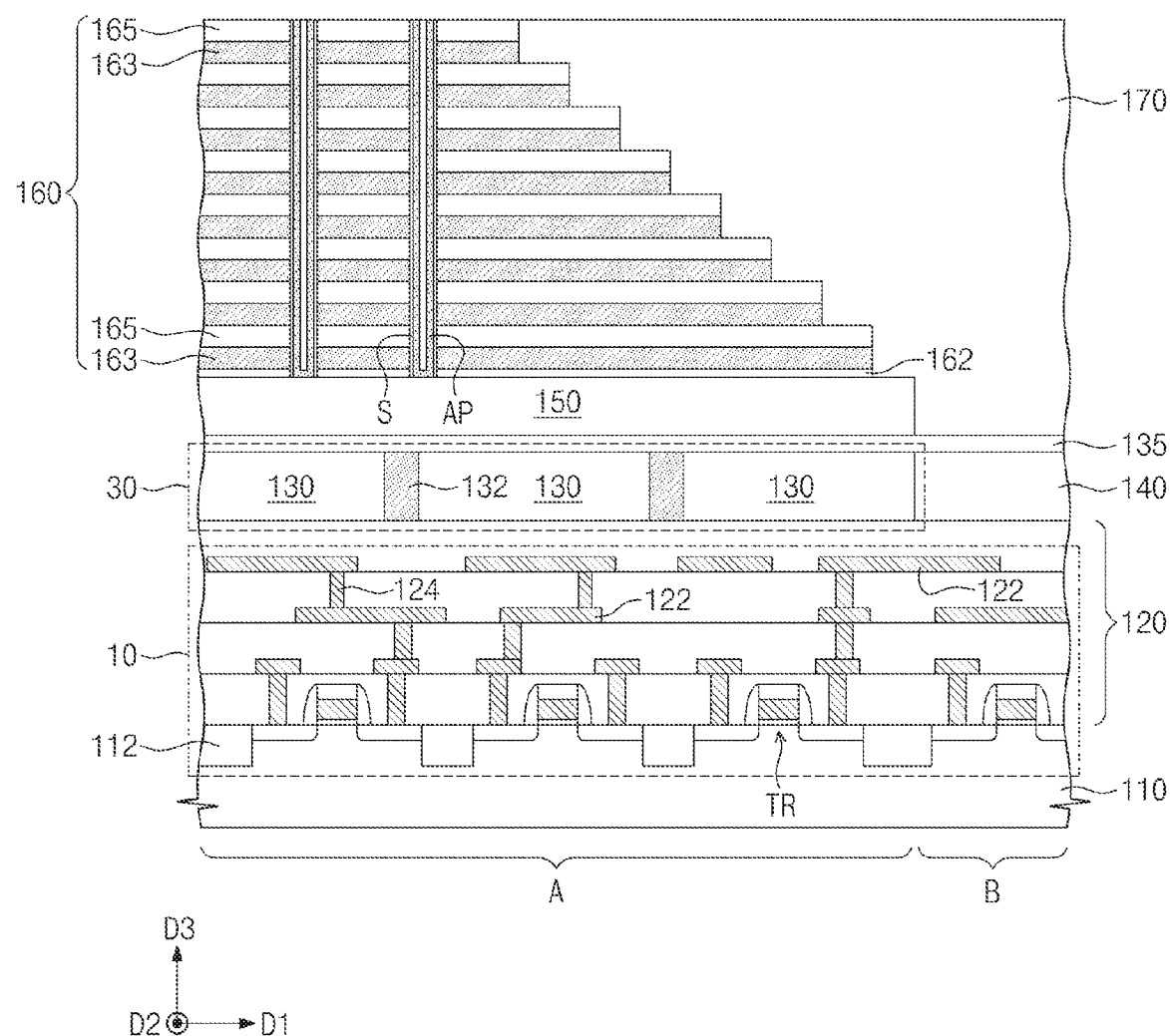
Figure 13B:
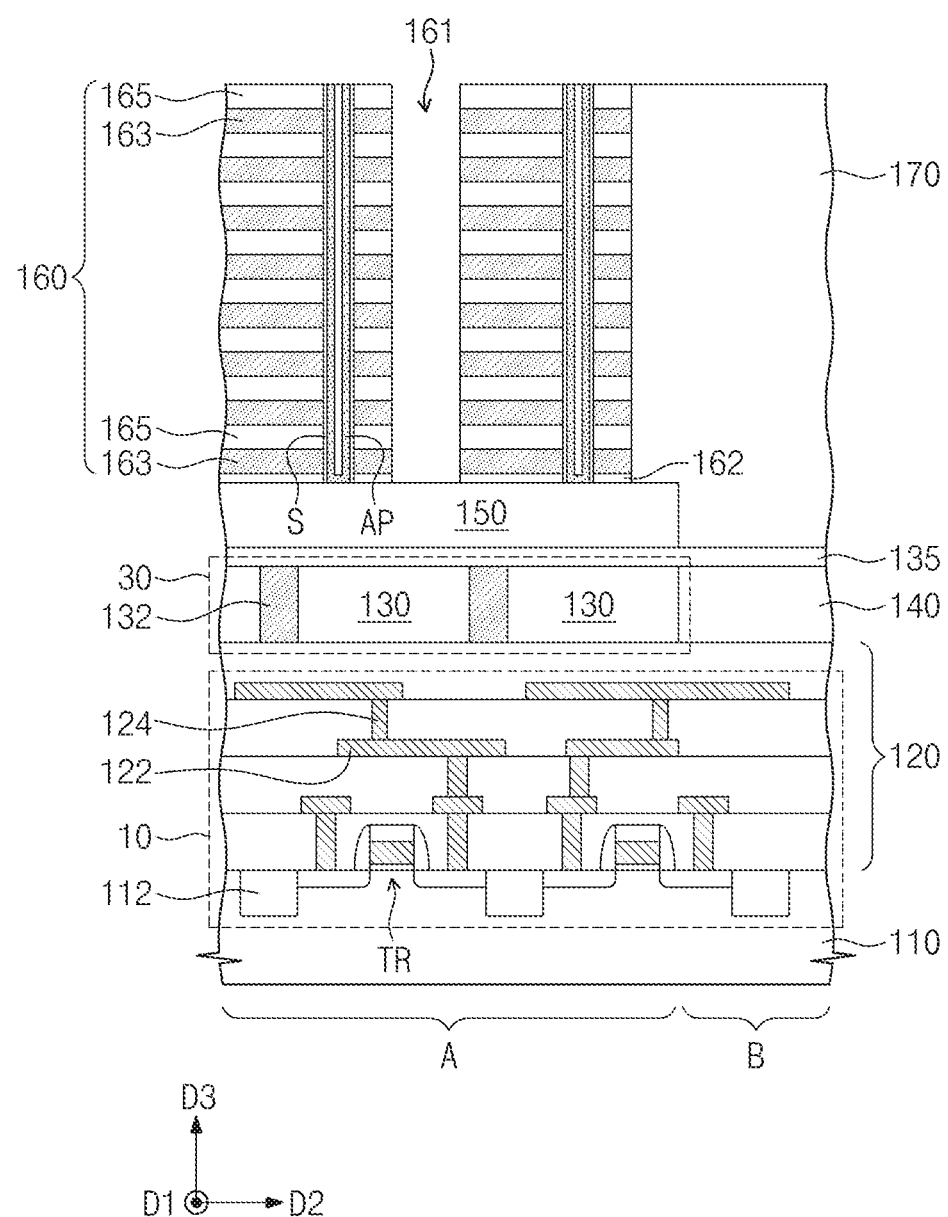

Referring to FIGS. 13A and 13B, a first upper insulating layer 170 may be formed to cover the preliminary stack 160. The first upper insulating layer 170 may be planarized to expose a top surface of the preliminary stack 160. The first upper insulating layer 170 may be a silicon oxide layer.

The preliminary stack 160 may be patterned to form a trench 161 extending in the first direction D1. The trench 161 may expose the semiconductor layer 150. The trench 161 may divide the preliminary stack 160 into segments constituting their own stacks separated from each other in the second direction D2. The patterned insulating layers 164 will be referred to as insulating patterns 165.

Figure 14A:
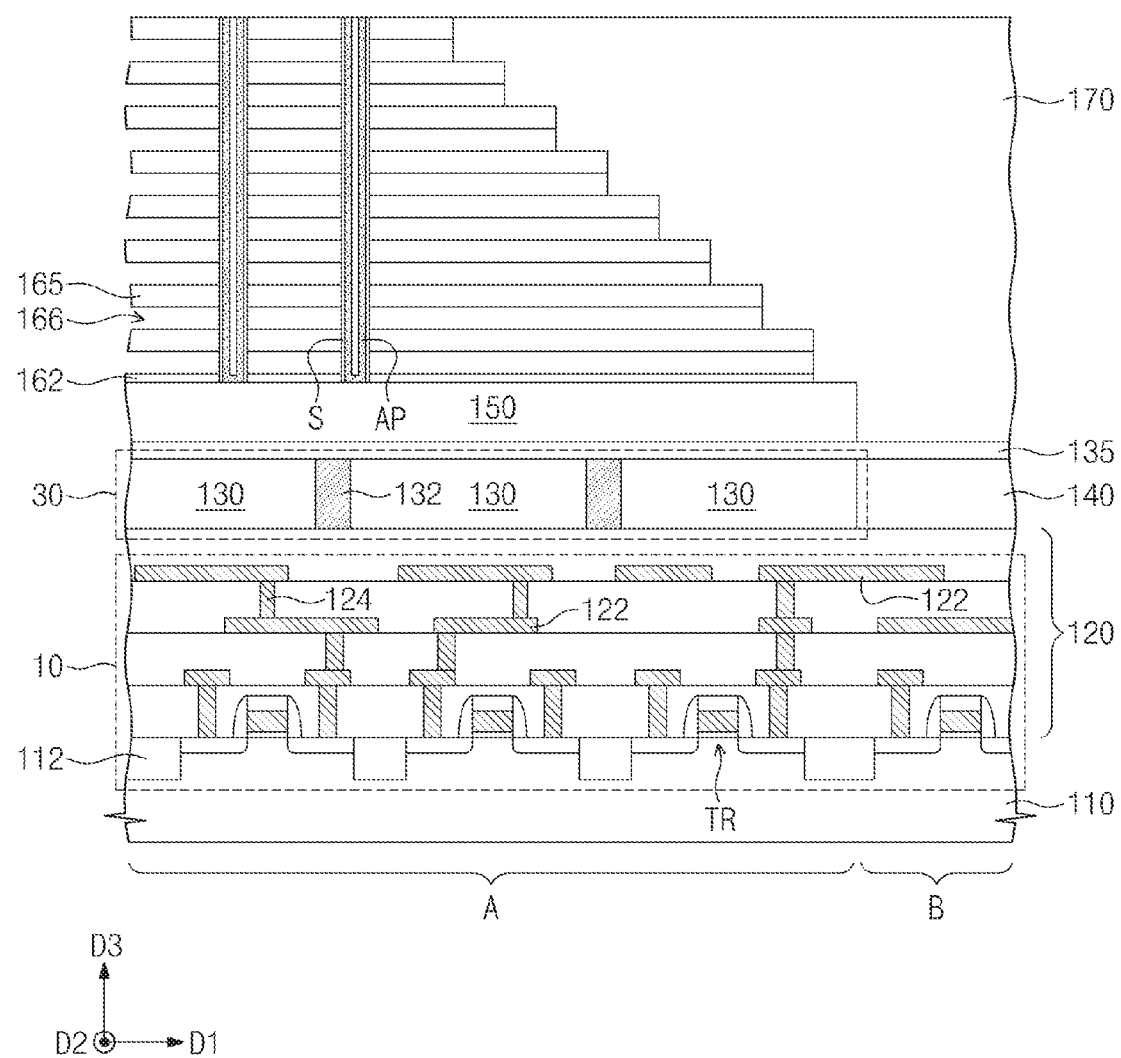
Figure 14B:
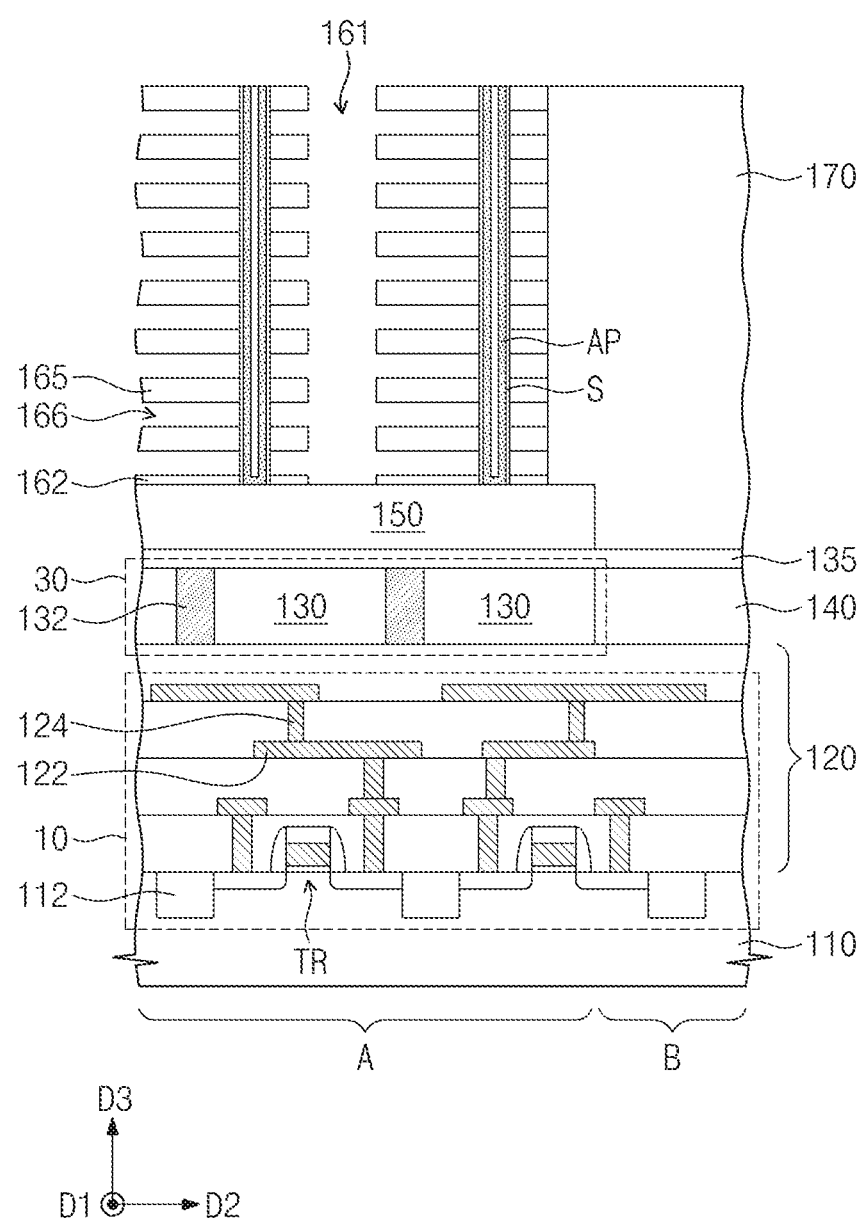

Referring to FIGS. 14A and 14B, the second sacrificial layers 163 exposed by the trench 161 may be selectively removed to form recess regions 166. The recess regions 166 are recesses formed by the removal of the second sacrificial layers 163 and may be defined by the vertical pillars AP and the insulating patterns 165. If the second sacrificial layers 163 are formed of silicon nitride or silicon oxynitride, the second sacrificial layers 163 may be removed using an etching solution including phosphoric acid.

Figure 15A:
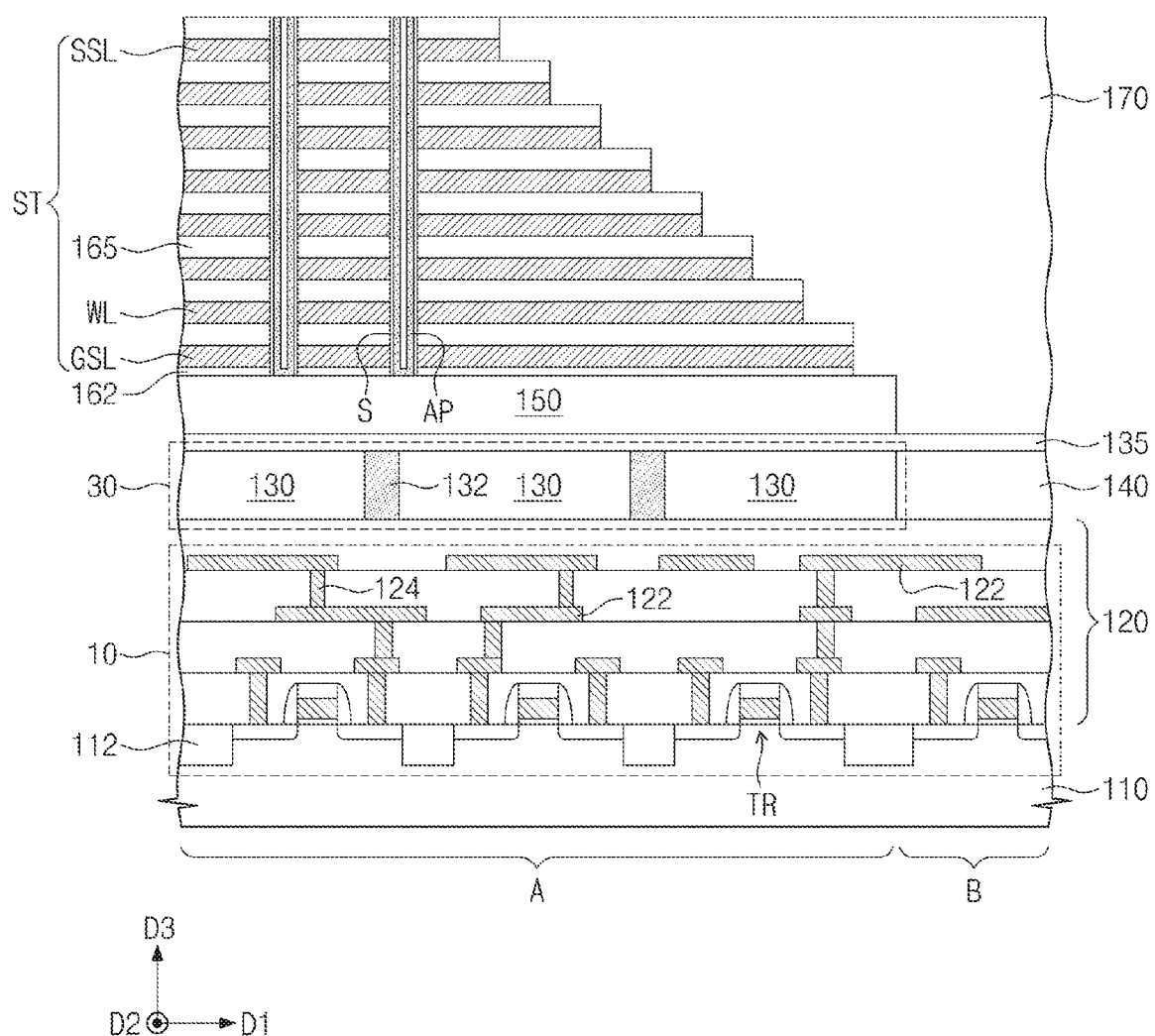
Figure 15B:
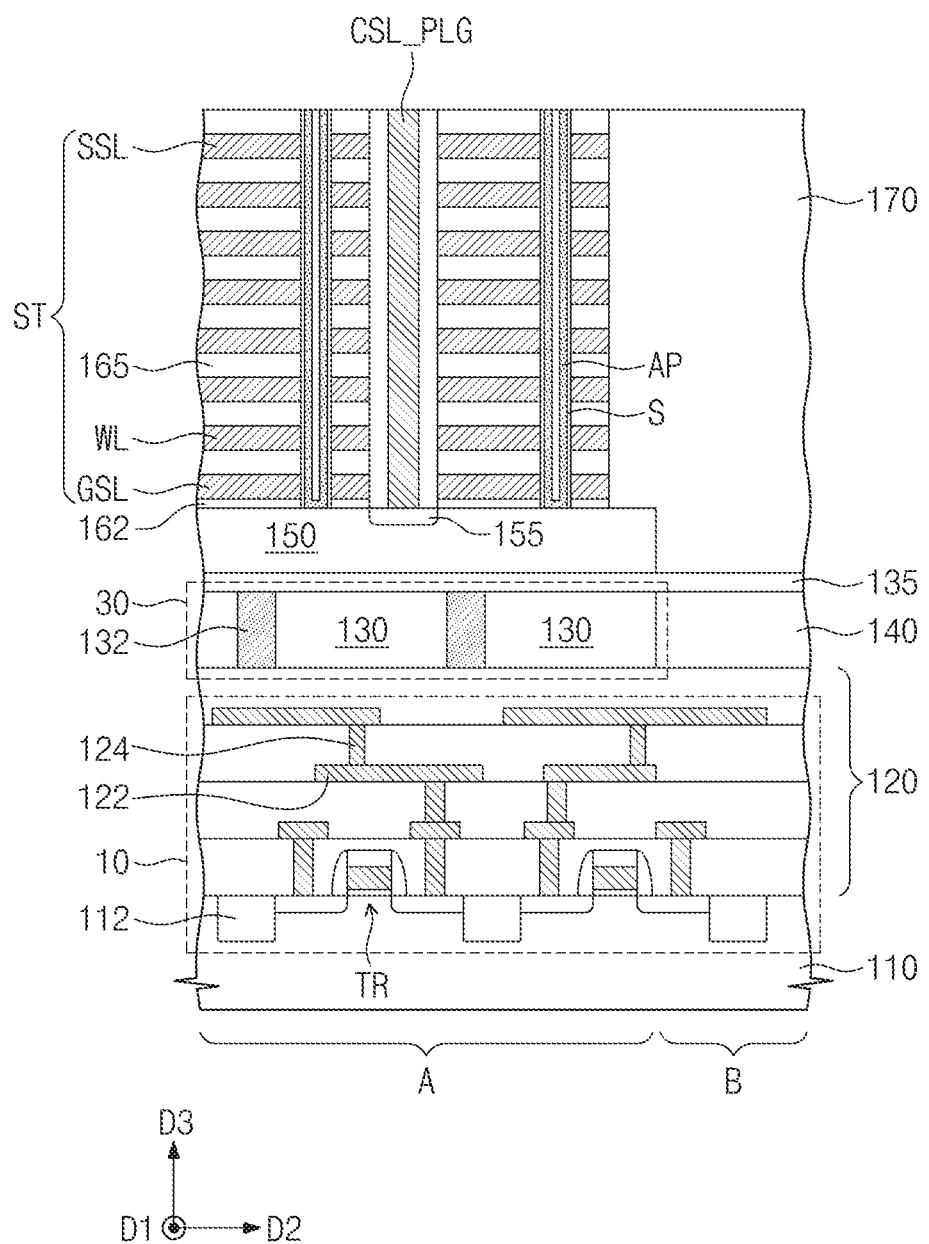

Referring to FIGS. 15A and 15B, a conductive layer (not shown) may be formed in the recess regions 166 through the trench 161. The conductive layer may be formed of at least one of a doped poly-crystalline silicon layer, a metal layer (e.g., a tungsten layer), and a metal nitride layer. In an example of this embodiment, the conductive layer is formed of a metal nitride layer and a metal layer formed on the metal nitride layer. The conductive layer may be formed by, for example, an atomic layer deposition (ALD) method.

The portions of the conductive layer outside the recess regions 166 (e.g., in the trench 161) may be removed to form electrodes GSL, WL, and SSL in the recess regions 166. The insulating patterns 165 and the electrodes GSL, WL, and SSL collectively form a stack ST. Also as a result, the semiconductor layer 150 may be exposed. Ions of a second conductivity types may be implanted into the exposed semiconductor layer 150 at a high dose, thereby forming a common source region 155 in the semiconductor layer 150.

A strapping plug CSL_PLG may be formed in the trench 161. The strapping plug CSL_PLG may be formed of a metal (e.g., tungsten, copper, or aluminum). The strapping plug CSL_PLG may be electrically connected to the common source region 155. An isolation insulating layer may be formed in the trench 161 before the strapping plug CSL_PLG is formed so that insulation is provided between the strapping plug CSL_PLG and surfaces of the stacks defining the trench 161.

As a result, a memory structure 20 may be formed. The memory structure 20 may include the semiconductor layer 150, the stack ST on the semiconductor layer 150, and a plurality of the vertical pillars AP penetrating the stack. The memory structure 20 may further include the data storage sections S disposed between each of the vertical pillars AP and the electrodes GSL, WL, and SSL of the stack ST.

Referring again to FIGS. 5, 6A, and 6B, first plugs PLG1 may be formed to extend through the first upper insulating layer 170 and the insulating patterns 165. The first plugs PLG1 may be connected to the ground selection and word lines GSL and WL, respectively. First pads PAD1 may be formed on the vertical pillars AP, respectively. Second pads PAD2 may be formed on the first plugs PLG1, respectively.

A second upper insulating layer 180 may be formed on the stack ST and the first upper insulating layer 170. The second upper insulating layer 180 may cover the first pads PAD1 and the second pads PAD2. In some embodiments, the common source line CSL is formed on the second upper insulating layer 180. The common source line CSL may be connected to the strapping plug CSL_PLG. The common source line CSL may extend in the first direction D1. A first upper interconnection M1 and a second upper interconnection M2 may be formed on the second upper insulating layer 180. The first upper interconnection M1 may be connected to the string selection line SSL through a second plug PLG2 and may be connected to the logic circuit of the logic structure 10 through a fourth plug PLG4. The second upper interconnection M2 may be connected to each of the ground selection and word lines GSL and WL through a third plug PLG5 and may be connected to the logic circuit of the logic structure 10 through a fifth plug PLG5. The fourth and fifth plugs PLG4 and PLG5 may be disposed in the connection region B and may extend through the second and first upper insulating layers 180 and 170, the capping layer 135, the intermediate insulating layer 140, and the lower insulating layer 120.

A third upper insulating layer 190 may be formed on the second upper insulating layer 180. Bit lines BL may be formed on the third upper insulating layer 190. Each of the bit lines BL may be connected to the vertical pillars AP through sixth plugs PLG6 and the first pads PAD1. In addition, each of the bit lines BL may be connected to the logic circuit of the logic structure 10 through a seventh plug PLG7. The seventh plug PLG7 may be disposed in the connection region B and may extend through the third to first upper insulating layers 190, 180, and 170, the capping layer 135, the intermediate insulating layer 140, and the lower insulating layer 120.

Each of the first to third upper insulating layers 170, 180, and 190 may be a silicon oxide layer.

In another example of this embodiment of a method of manufacturing a semiconductor device, the supports 132 are not formed and the first sacrificial layer 131 is not removed. In this case, the first sacrificial layer 131 is formed of the same material as the material 131 of the stress relaxation structure 30 described with reference to FIGS. 7A and 7B. In this embodiment. Thus, the semiconductor device illustrated in FIGS. 7A and 7B may be realized.

Figure 16:
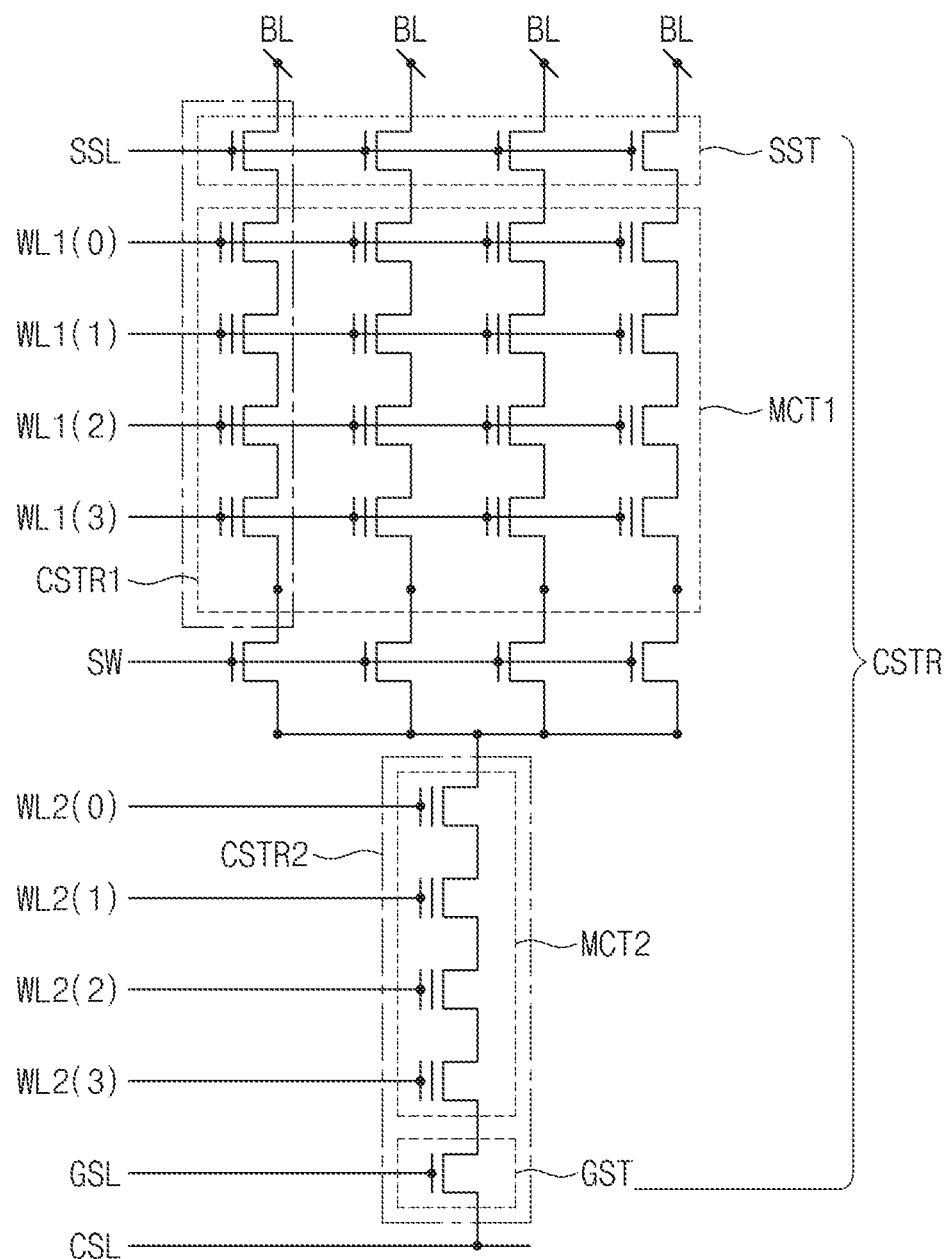
FIG. 16 is a circuit diagram of yet another example of a memory structure of semiconductor devices according to the inventive concepts.

FIG. 16 illustrating the equivalent circuit of a memory structure of another embodiment of a semiconductor device according to the inventive concepts. Referring to FIG. 16, this embodiment of a semiconductor device according to the inventive concepts includes a common source line CSL, a plurality of bit lines BL, and cell strings CSTR between the common source line CSL and the bit lines BL.

The common source line CSL may be a conductive pattern disposed on a substrate, and the bit lines BL may be conductive patterns (e.g., metal lines) disposed on the substrate.

The cell strings CSTR may include upper strings CSTR1 respectively connected to the bit lines BL and a single lower string CSTR2 connected to the common source line CSL. The upper strings CSTR1 may be connected in common to the single lower string CSTR2. The upper strings CSTR1 may be connected in common to the lower string CSTR2 through switching elements SW. The switching elements SW connected to the upper strings CSTR1 may be supplied with the same electrical voltage.

Each of the upper strings CSTR1 may include a string selection transistor SST connected to a respective one of the bit lines BL and a plurality of upper memory cell transistors MCT1 disposed between the string selection transistor SST and the switching element SW. The string selection transistor SST and the upper memory cell transistors MCT1 may be connected in series to each other. The lower string CSTR2 may include a ground selection transistor GST connected to the common source line CSL and a plurality of lower memory cell transistors MCT2 disposed between the ground selection transistor GST and the plurality of switching elements SW. The ground memory cell transistors GST and the lower memory cell transistors MCT2 may be connected in series to each other.

A string selection line SSL and upper word lines WL1(0) to WL1(3) which are disposed between the bit lines BL and the switching elements SW may be used as gate electrodes of the string selection transistor SST and the upper memory cell transistors MCT1, respectively. A ground selection line GSL and lower word lines WL2(0) to WL2(3) which are disposed between the common source lines CSL and the switching elements SW may be used as gate electrodes of the ground selection transistor GST and the lower memory cell transistors MCT2, respectively. Each of the upper and lower memory cell transistors MCT1 and MCT2 may include a data storage element.

The upper strings CSTR1 respectively connected to the bit lines BL may be connected in common to the single lower string CSTR2 connected to the common source line CSL. Thus, the upper strings CSTR1 which include the string selection transistors SST respectively connected to the bit lines BL may share the ground selection transistor GST of the single lower string CSTR2. In other words, the upper strings CSTR1 which are connected to different bit lines BL and are operated independently of each other may be connected in common to the single lower string CSTR2 to share the ground selection transistor GST. Thus, a highly integrated semiconductor device may be realized.

Figure 17:
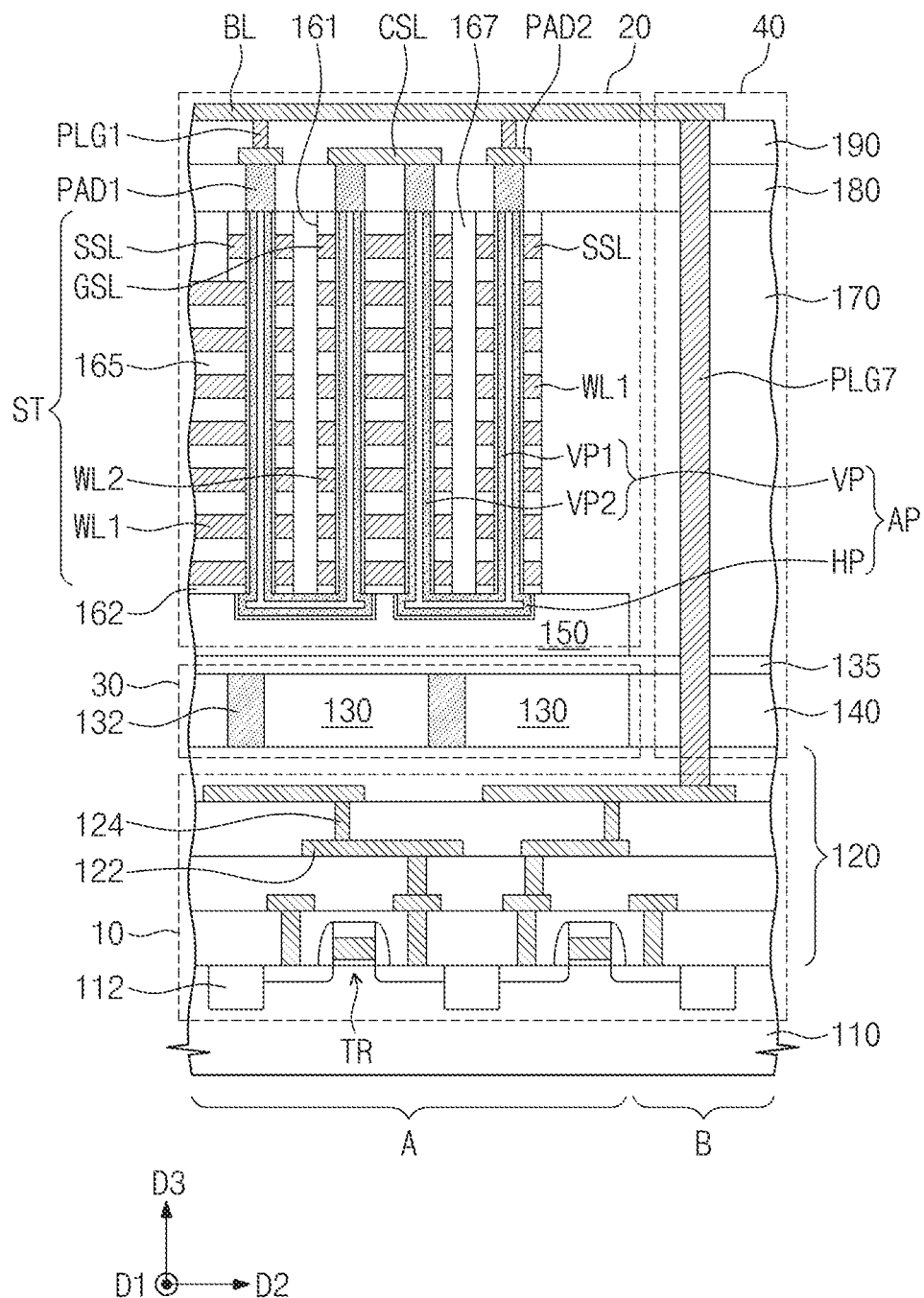
FIG. 17 is a cross-sectional view of an embodiment of a semiconductor device according to the inventive concepts.

FIG. 17 illustrates another embodiment of a semiconductor device according to the inventive concepts.

Referring to FIG. 17, a memory structure 20 may include a semiconductor layer 150, a stack ST on the semiconductor layer 150, and a plurality of vertical pillars AP extending through the stack ST. The stack ST may include insulating patterns 165 and electrodes disposed between the insulating patterns 165.

The electrodes may be sequentially vertically stacked (e.g., in the third direction D3). The electrodes may include a ground selection line GSL, word lines WL, and a string selection line SSL. The string selection line SSL may be disposed between the word lines and the bit lines BL. The ground selection line GSL may be disposed between the word lines WL and the common source line CSL. The word lines WL may be sequentially stacked on the semiconductor layer 150. The string selection line SSL and the ground selection line GSL may be disposed on the word lines WL. The string selection line SSL and the ground selection line GSL may be spaced apart from each other in the second direction D2 by a trench 161. The word lines WL may include upper word lines WL1 disposed between the semiconductor layer 150 and the string selection line SSL, and lower word lines WL2 disposed between the semiconductor layer 150 and the ground selection line GSL. The upper word lines WL1 may be spaced apart from the lower word lines WL2 in the second direction D2 by the trench 161.

A device isolation pattern 167 may be interposed between the string selection line SSL and the ground selection line GSL and between the upper word lines WL1 and the lower word lines WL2. The device isolation pattern 167 may have a linear shape and extend in the first direction D1. The device isolation pattern 167 may fill the trench 161 and may include at least one of a silicon oxide layer, a silicon nitride layer, and a silicon oxynitride layer.

The vertical pillars AP may be arrayed in the first direction D1 as viewed in plan. Each of the vertical pillars AP may include vertical portions VP extending through the stack ST and a horizontal portion HP disposed under the stack ST. The horizontal portion HP may be connected to the vertical portions VP. The vertical portions VP may be provided in vertical holes extending through the stack ST. The horizontal portion HP may be provided in a horizontal recess in an upper portion of the semiconductor layer 150. One of the vertical portions VP may be connected to the common source line CSL, and the other of the vertical portions VP may be connected to one of the bit lines BL. The horizontal portion HP may extend between the semiconductor layer 150 and the stack ST to connect the vertical portions VP to each other.

More specifically, the vertical portions VP of each of the vertical pillars AP may include a first vertical portion VP1 extending through the string selection line SSL and the upper word lines WL1 and a second vertical portion VP2 extending through the ground selection line GSL and the lower word lines WL2. The first vertical portions VP1 may be connected to one of the bit lines BL, and the second vertical portion VP2 may be connected to the common source line CSL. The horizontal portion HP may extend from under the upper word lines WL1 and beneath the lower word lines WL2 to connect the first vertical portion VP1 to the second vertical portion VP2.

Each of the vertical pillars AP may include a semiconductor pattern that extending through the stack ST so as to be electrically connected to the semiconductor layer 150. The semiconductor pattern of the vertical portion VP may line the vertical holes. The semiconductor pattern of the horizontal portion HP may line the above-mentioned recess. The semiconductor pattern may comprise a semiconductor material.

A method of manufacturing such a semiconductor device according to the inventive concepts will be described hereinafter with reference to FIGS. 18 to 23.

Figure 18:
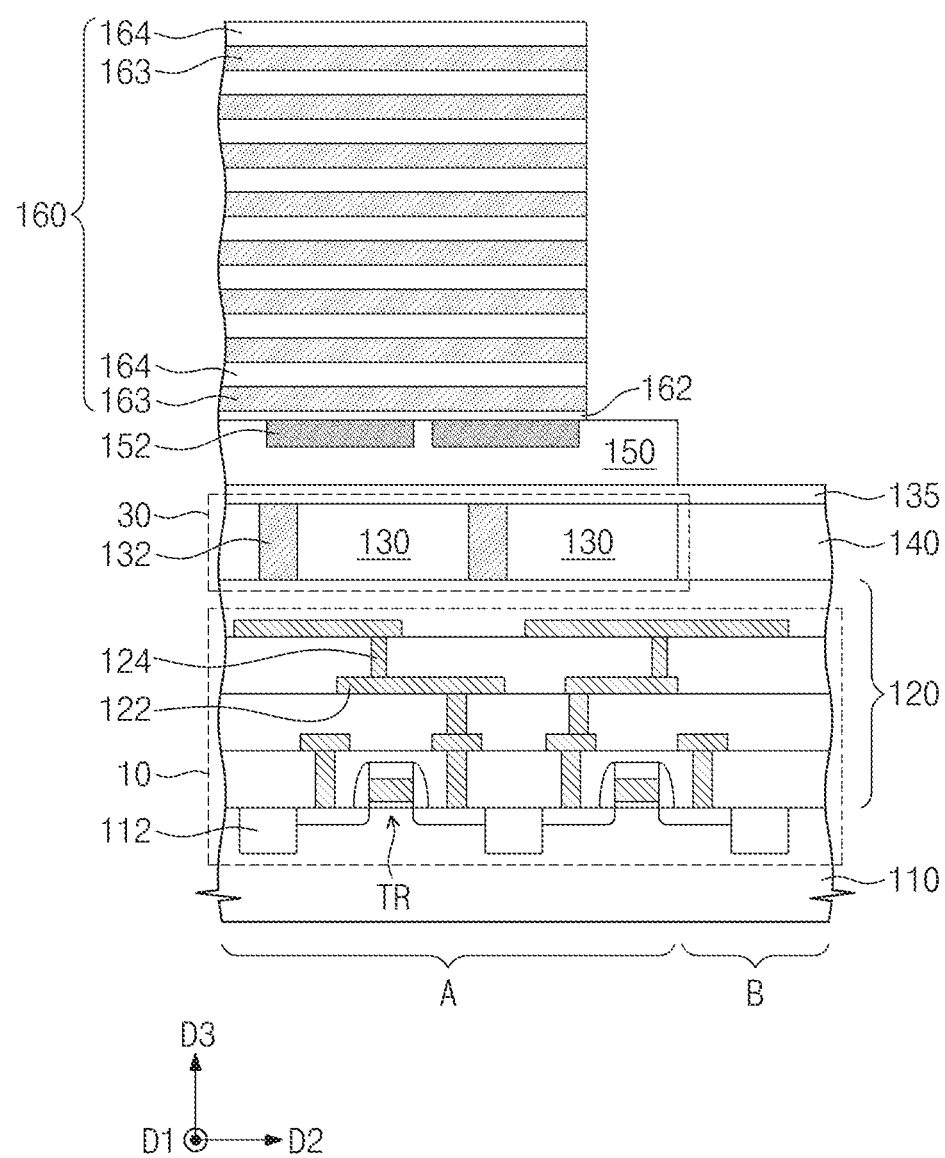
FIGS. 18, 19, 20, 21, 22 and 23 are cross-sectional views of a semiconductor device of the type shown in FIG. 17 during the course of its manufacture and together illustrate a method of manufacturing the semiconductor device according to the inventive concepts.

Referring to FIG. 18, a logic structure 10 and a stress relaxation structure 30 may be formed on the semiconductor substrate 110 by the same method as described above with reference to FIG. 8A-9B or 8A-10B. A semiconductor layer 150 may be formed on the stress relaxation structure 30, and at least one buried sacrificial pattern 152 may be formed in the semiconductor layer 150. A buffer dielectric layer 162 and a preliminary stack 160 may be formed on the semiconductor layer 150.

The buried sacrificial pattern 152 may be formed of a material having an etch selectivity with respect to the preliminary stack 160. For example, the buried sacrificial pattern 152 may be formed of silicon nitride, silicon oxynitride, germanium, or silicon-germanium. The buried sacrificial pattern 152 may have an island shape. A plurality of island-shaped buried sacrificial patterns 152 may be formed as arrayed two-dimensionally. The preliminary stack 160 may include sacrificial layers 163 and insulating layers 164 which are alternately stacked on the semiconductor layer 150.

Figure 19:
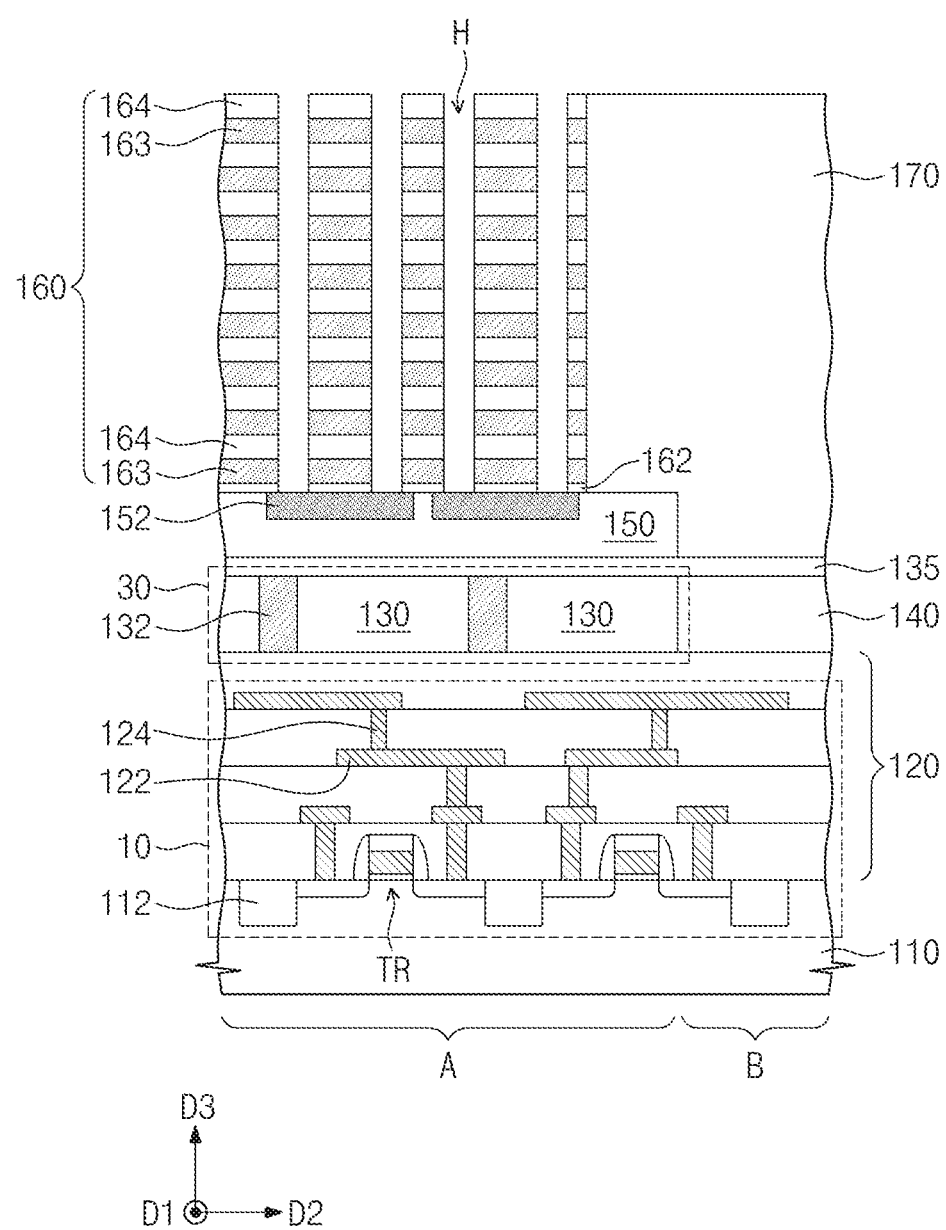
Figure 20:
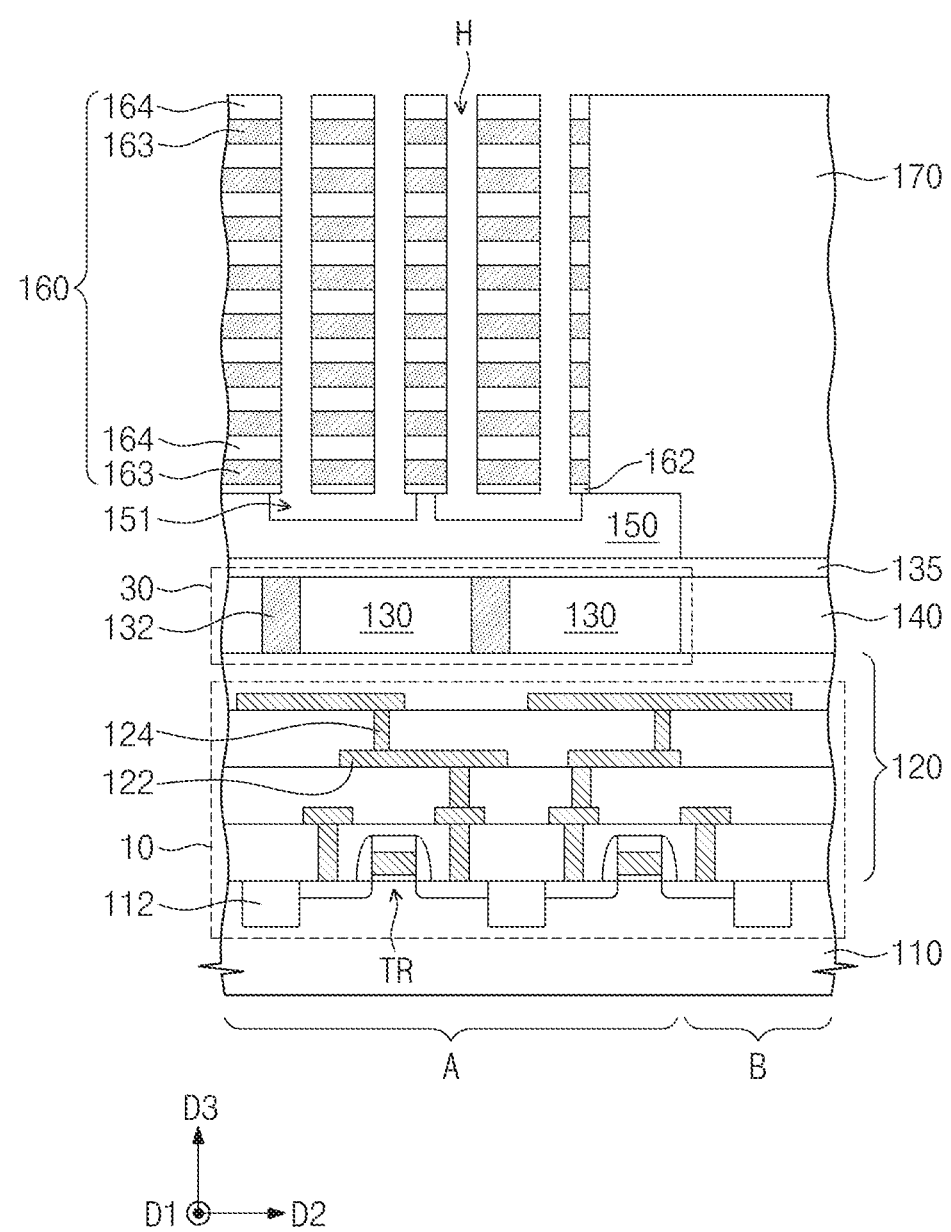

Referring to FIGS. 19 and 20, a first upper insulating layer 170 may be formed on the semiconductor substrate 110. The first upper insulating layer 170 may expose a top surface of the preliminary stack 160. Vertical holes H may be formed through the preliminary stack 160. The vertical holes H may expose top surfaces of the buried sacrificial patterns 152. The exposed buried sacrificial patterns 152 may be selectively removed to form horizontal recesses 151. A pair of vertical holes H may be formed on one buried sacrificial pattern 152. Thus, one horizontal recess 151 and the pair of vertical holes H formed thereon may collectively have a U-shaped cross section, as illustrated in FIG. 20.

Figure 21:
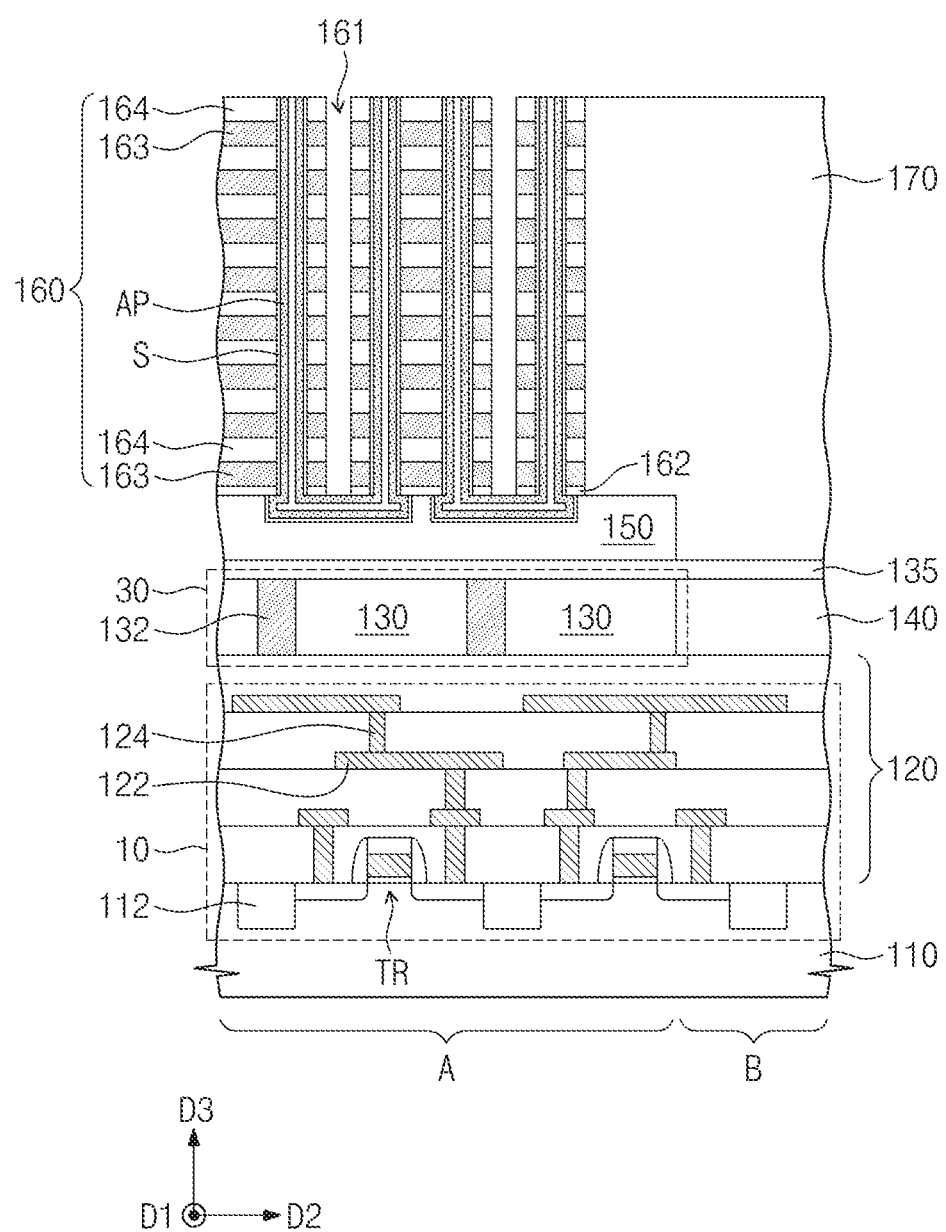

Referring to FIG. 21, vertical pillars AP may be formed along the horizontal recesses 151 and the vertical holes H. The vertical pillars AP may not completely fill the horizontal recesses 151 and the vertical holes H so as to leave an inner hole. The inner hole may be filled with a filling insulation layer. A data storage section S may be formed before the vertical pillars AP are formed. A gate insulating layer may be formed on the inner surface defining the horizontal recess 151 before the data storage section S is formed. The gate insulating layer may be formed by thermally treating the semiconductor layer 150.

Figure 22:
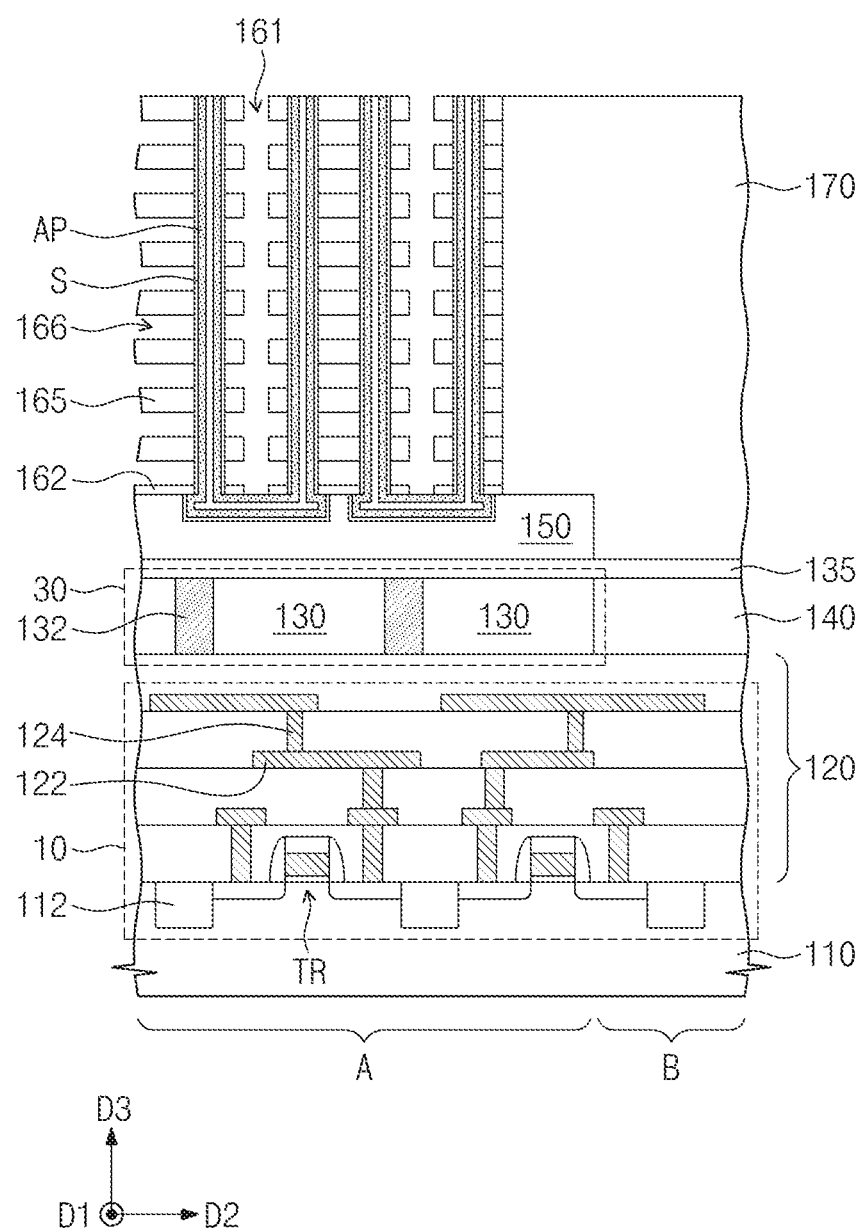

Referring to FIG. 22, the preliminary stack 160 may be patterned to form a trench 161 intersecting the horizontal recess 151. The trench 161 may be formed between the vertical holes H connected in common to one horizontal recess 151. The insulating layers 164 may be patterned by the process of forming the trench 161 to form insulating patterns 165. The sacrificial layers 163 exposed by the trench 161 may be selectively removed to form recesses 166.

Figure 23:
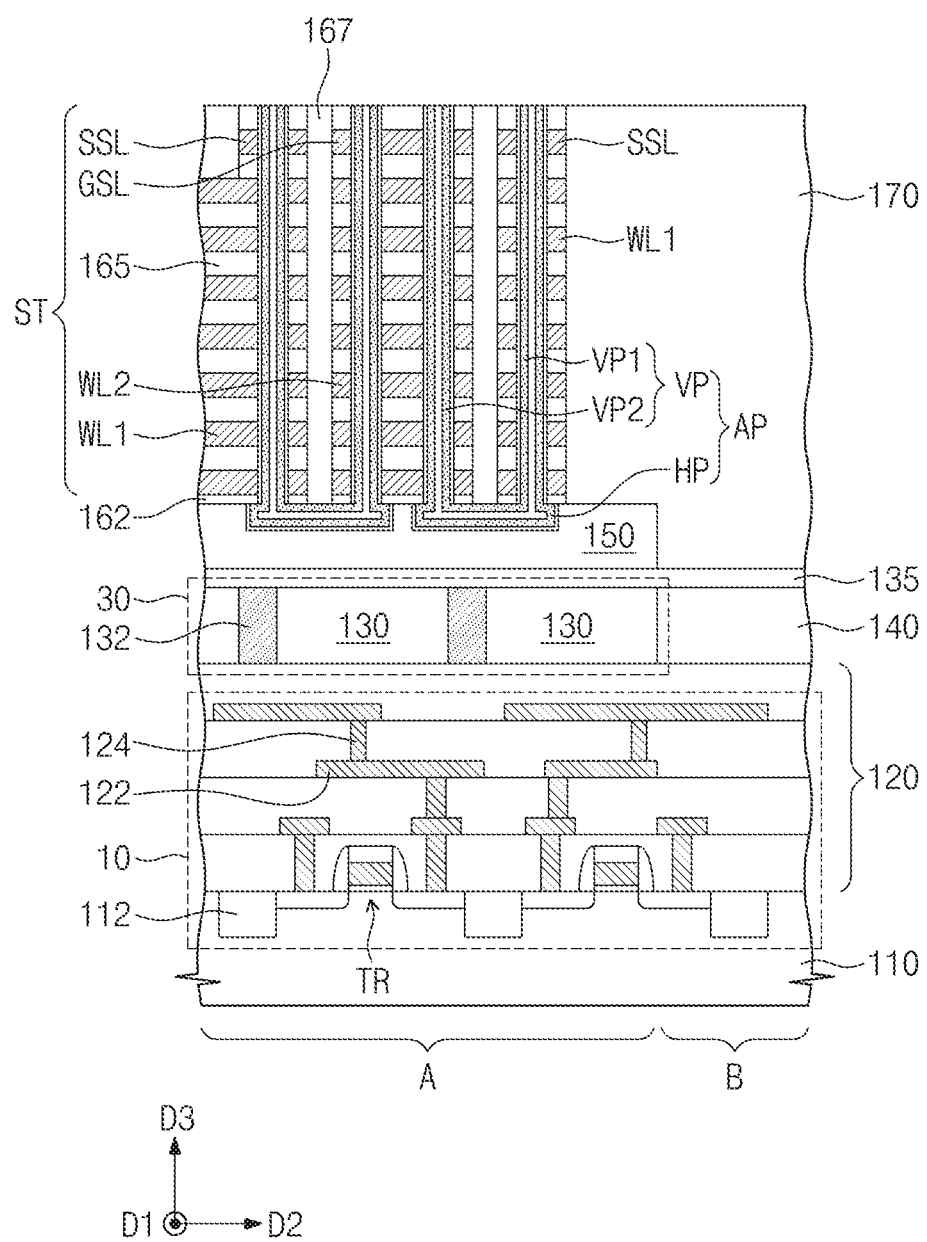

Referring to FIG. 23, conductive patterns may be formed in the recesses 166 through the trench 161. The conductive patterns may be formed of at least one of doped polycrystalline silicon, a metal (e.g., tungsten), and a metal nitride. Each of the conductive patterns may include a metal nitride layer and a metal layer disposed on the metal nitride layer. One or some of the uppermost ones of the conductive patterns may be patterned to define string selection lines SSL. Thus, a ground selection line GSL spaced apart from the string selection line SSL may also be defined. The conductive patterns under the string and ground selection lines SSL and GSL may correspond to word lines WL1 and WL2. The trench 161 may be filled with a device isolation pattern 167. Thus, the string selection, word and ground selection lines SSL, WL1, WL2, and GSL may be formed.

Referring again to FIG. 17, pads PAD1 and PAD2 and a common source line CSL connected to the vertical pillars AP may be formed. Thereafter, bit lines BL may be formed to be connected to the pads PAD1 and PAD2 through first plugs PLG1. Each of the bit lines BL may be connected to the logic circuit of the logic structure 10 through a second plug PLG7. The second plug PLG7 may be disposed in the connection region B and may extend through the first to third upper insulating layers 170, 180, and 190, the capping layer 135, the intermediate insulating layer 140, and the lower insulating layer 120.

Another embodiment of a method of manufacturing a semiconductor device according to the inventive concepts will be described hereinafter with reference to FIGS. 24 and 25. Processes similar to those described above with reference to FIGS. 17-23 will not be described again in detail or will only be mentioned briefly for the sake of brevity.

Figure 24:
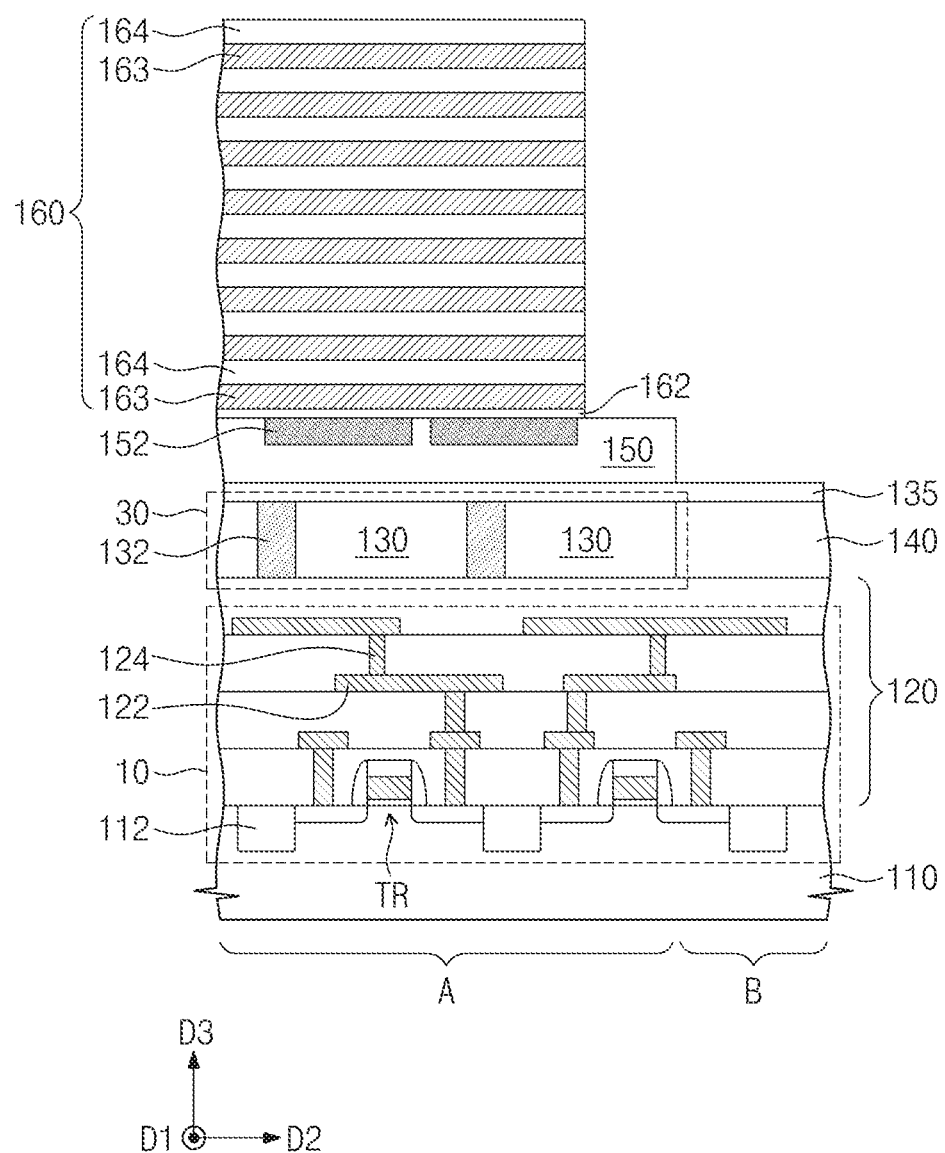
FIGS. 24 and 25 are also cross-sectional views of a semiconductor device of the type shown in FIG. 17 during the course of its manufacture and illustrate steps in another example of a method of manufacturing the semiconductor device according to the inventive concepts.

Referring to FIG. 24, a logic structure 10 and a stress relaxation structure 30 may be formed on the semiconductor substrate 110. A semiconductor layer 150 may be formed on the stress relaxation structure 30, and at least one buried sacrificial pattern 152 may be formed in the semiconductor layer 150. A buffer dielectric layer 162 and a preliminary stack 160 may be formed on the semiconductor layer 150.

The preliminary stack 160 may include insulating layers 164 and conductive layers 168 between the insulating layers 164. The insulating layers 164 may be silicon oxide layers. Each of the conductive layers 168 may include at least one of doped silicon, a metal (e.g., tungsten), a metal nitride, and a metal silicide.

Figure 25:
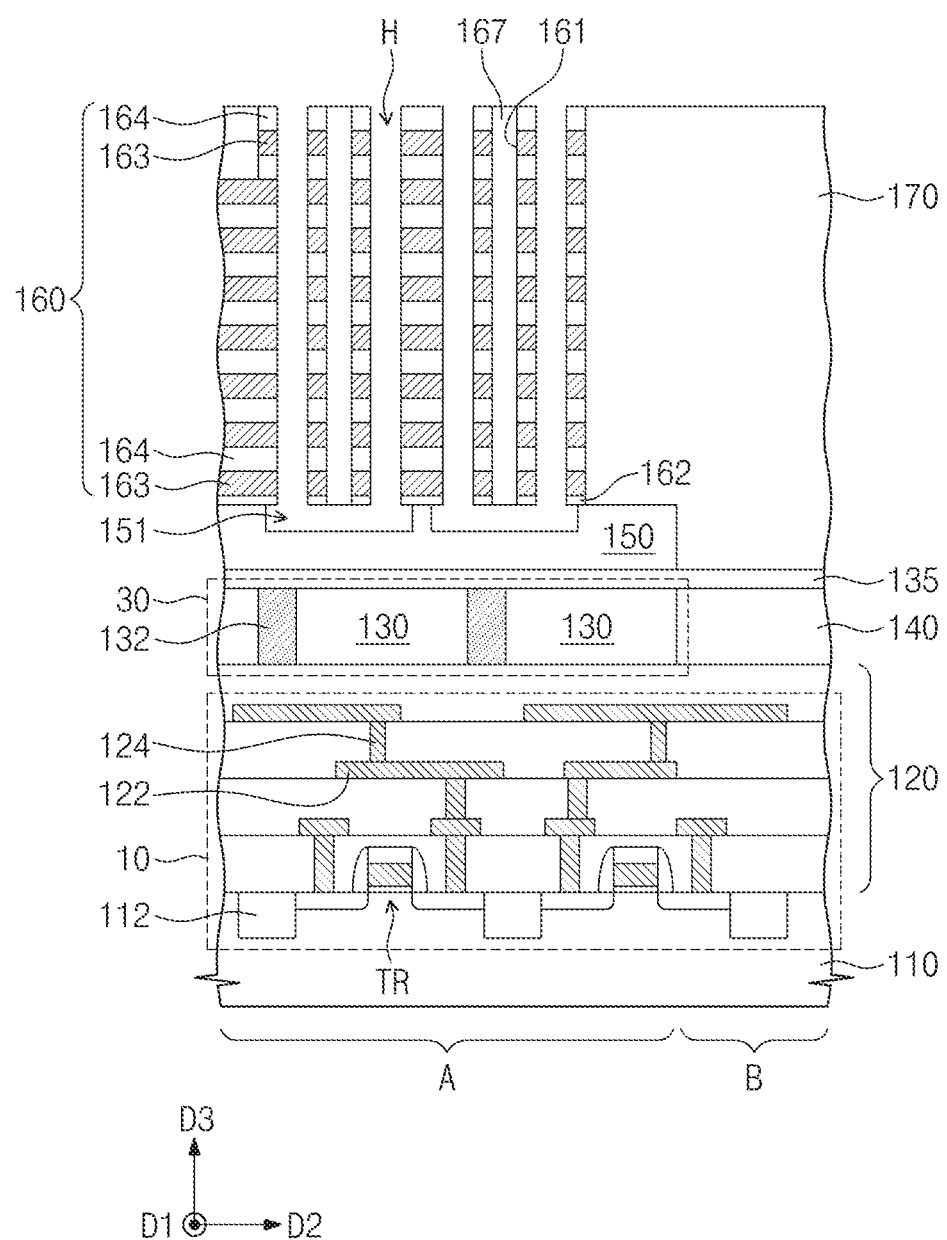

Referring to FIG. 25, a trench 161 may be formed to expose the buried sacrificial pattern 152. The trench 161 may extend in the first direction D1. A device isolation pattern 167 filling the trench 161 may be formed. The device isolation pattern 167 may comprise silicon oxide.

Vertical holes H exposing a top surface of the buried sacrificial pattern 152 may be formed through the preliminary stack 160. The exposed buried sacrificial pattern 152 may be selectively removed to form a horizontal recess 151. A pair of vertical holes H may be formed on one buried sacrificial pattern 152. Thus, one horizontal recess 151 and the pair of vertical holes H formed thereon may collectively have a U-shaped cross section.

Referring again to FIG. 17, pads PAD1 and PAD2 and a common source line CSL connected to the vertical pillars AP may be formed. Subsequently, bit lines BL may be formed to be connected to the pads PAD1 and PAD2 through first plugs PLG1. Each of the bit lines BL may be connected to the logic circuit of the logic structure 10 through a second plug PLG7. The second plug PLG7 may be disposed in the connection region B and may extend through the first to third upper insulating layers 170, 180, and 190, the capping layer 135, the intermediate insulating layer 140, and the lower insulating layer 120.

Figure 26:
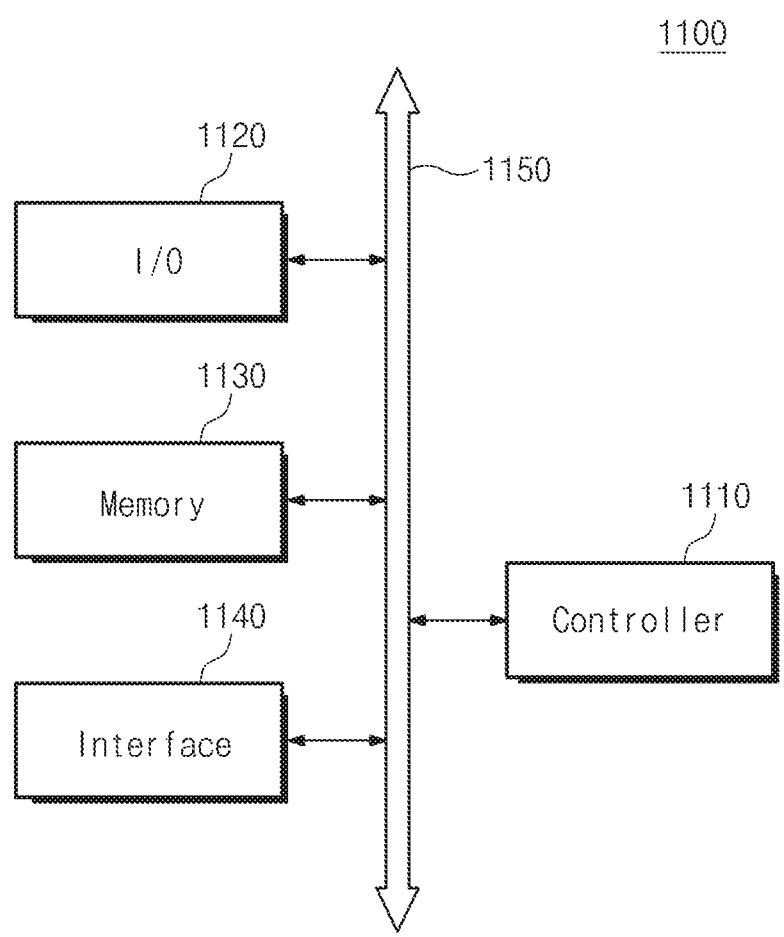
FIG. 26 is a schematic block diagram of an embodiment of an electronic system including a memory device according to the inventive concepts.

FIG. 26 illustrates an embodiment of an electronic system including a memory device according to the inventive concepts.

Referring to FIG. 26, an electronic system 1100 according to the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may constitute a path through which electrical data are transmitted. The memory device 1130 may include at least one semiconductor device according to the inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which act/acts as a working memory for improving an operation of the controller 1110.

The electronic system 1100 may be that of a personal digital assistant (PDA), a portable computer, a web tablet, a wireless phone, a mobile phone, a digital music player, a memory card, or other electronic product receiving and/or transmitting data by wireless.

Figure 27:
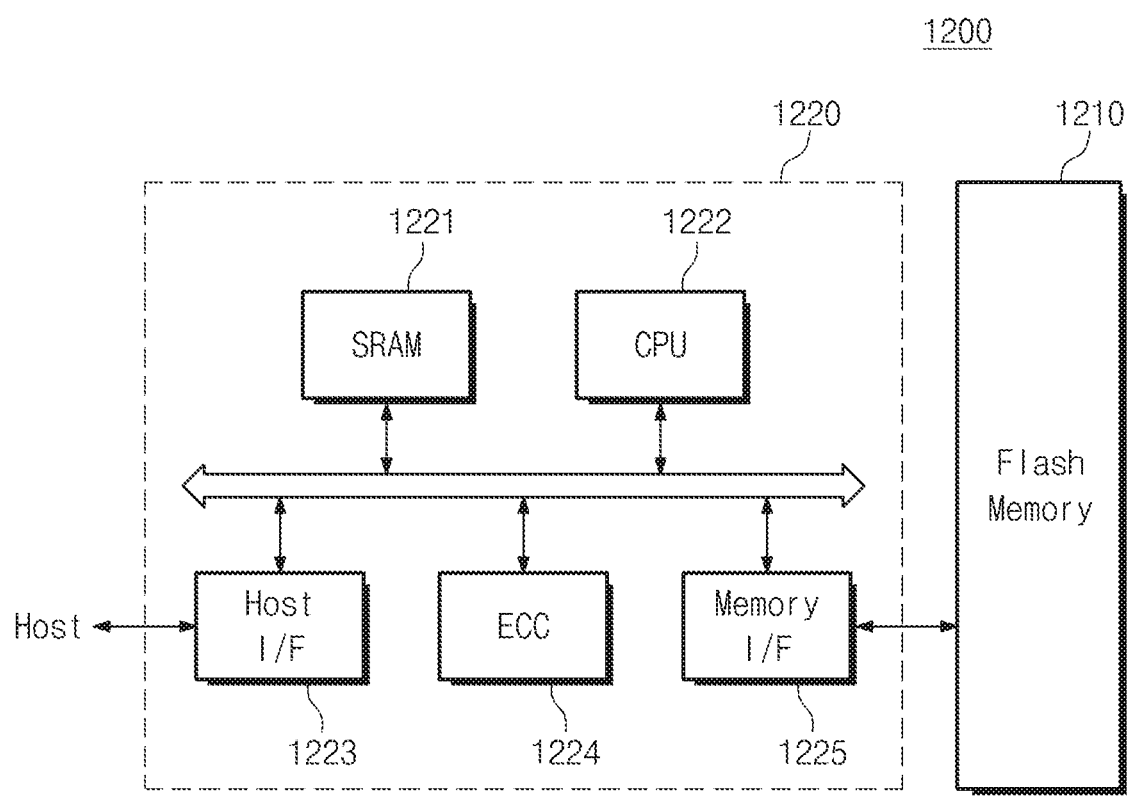
FIG. 27 is a schematic block diagram of an embodiment of a memory card including a memory device according to the inventive concepts.

FIG. 27 illustrates an embodiment of a memory card including a semiconductor memory device according to the inventive concepts.

Referring to FIG. 27, a memory card 1200 includes a memory device 1210. The memory device 1210 may include at least semiconductor device according to the inventive concepts. In addition, the memory device 1210 may further include another type of a semiconductor memory device (e.g., a DRAM device and/or a SRAM device). The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may provide a data communication protocol between the memory card 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code to interface with the host. The memory card 1200 may be used as a portable data storage card. Alternatively, the memory card 1200 may serve as a solid state drive (SSD) of a computer system.

Figure 28:
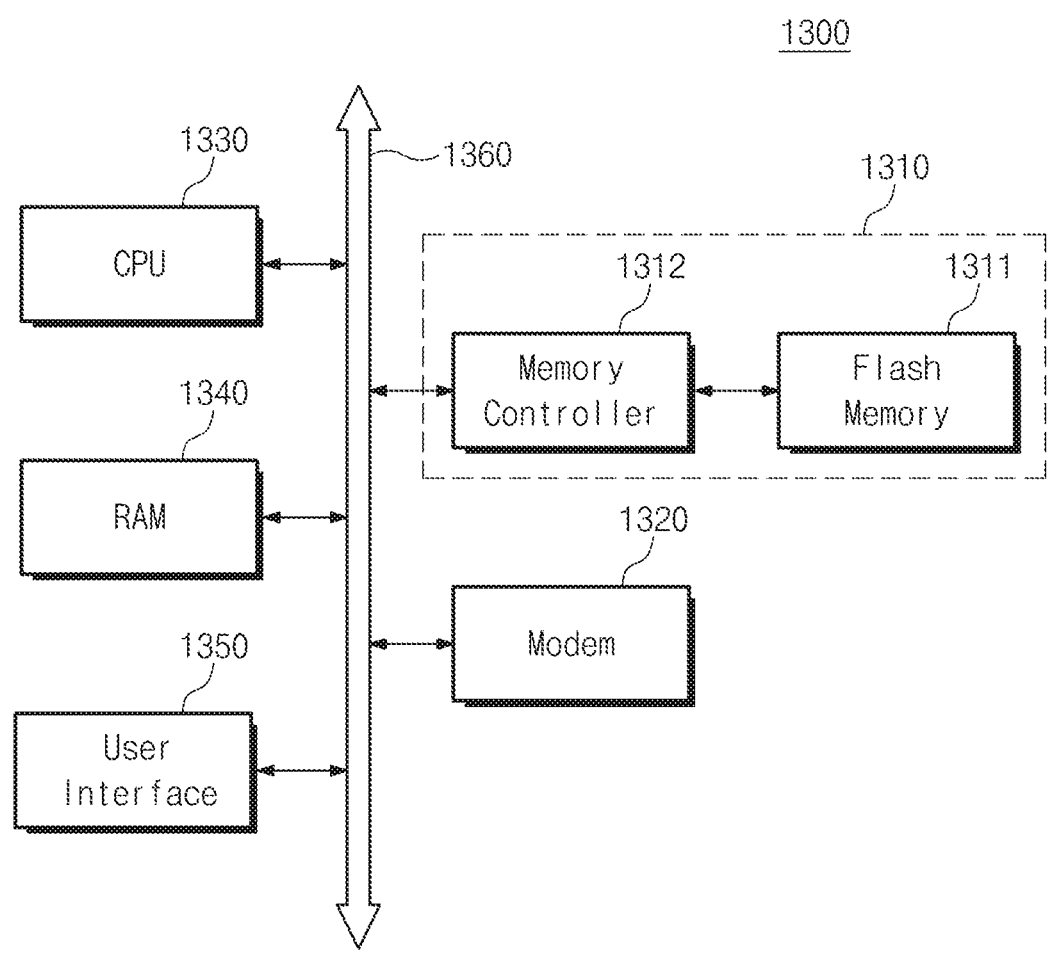
FIG. 28 is a schematic block diagram of an embodiment of an information processing system including a memory device according to the inventive concepts.

FIG. 28 illustrates an embodiment of an information processing system including a semiconductor memory device according to the inventive concepts.

Referring to FIG. 28, a flash memory system 1310 may be installed in an information processing system 1300 such as a mobile device or a desk top computer. The flash memory system 1310 may include a flash memory device 1311 and a memory controller 1312. The flash memory device 1311 may include at least one semiconductor device according to the inventive concepts. The information processing system 1300 may include a modem 1320, a central processing unit (CPU) 1330, a random access memory (RAM) 1340, and a user interface unit 1350 which are electrically connected to the flash memory system 1310 through a system bus 1360. The flash memory system 1310 may store data processed by the CPU 1330 or data inputted from an external system. In some embodiments, the flash memory system 1310 may be realized as a solid state drive (SSD). In this case, the information processing system 1300 may stably store a massive quantity of data in the flash memory system 1310. In addition, as reliability of the flash memory system 1310 increases, the flash memory system 1310 may reduce a resource consumed for correcting errors. Thus, the flash memory system 1310 may provide a fast data communication function to the information processing system 1300. Even though not shown in the drawings, the information processing system 1300 may further include an application chipset, a camera image processor (CIS), and/or an input/output unit.

According to embodiments of the inventive concepts, a stress relaxation structure is provided to relieve stress in a semiconductor memory device. The stress may be that created by forming a memory structure (e.g., a stack that includes semiconductor memory elements disposed at a plurality of levels) on logic circuitry at an upper portion of a substrate. The stress may additionally be that created by forming a connection section beside the memory structure and which electrically connects the memory structure to the logic circuitry. Thus, the integrity of the logic circuitry may be maintained.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments and examples described above but by the following claims.

What is claimed is:
1. A semiconductor device comprising:
a semiconductor substrate;
a logic structure including a logic circuit at an upper part of the semiconductor substrate in a circuit region of the device, and lower insulation covering the logic circuit;
a memory structure disposed on the logic structure; and
a stress relaxation structure interposed between the logic structure and the memory structure in the circuit region.
2. The semiconductor device of claim 1, wherein the memory structure comprises:
a semiconductor layer;
a stack including a plurality of electrodes vertically stacked on the semiconductor layer; and
a plurality of vertical pillars extending through the stack.
3. The semiconductor device of claim 2, wherein the memory structure further comprises: a respective data storage section interposed between each of the vertical pillars and the electrodes.
4. The semiconductor device of claim 3, further comprising:
upper insulation covering the stack;
first upper interconnections disposed in the upper insulation and connected to the vertical pillars, respectively; and
first plugs connecting the logic circuit to the first upper interconnections,
wherein the first plugs are disposed in a connection region of the device beside the circuit region.
5. The semiconductor device of claim 4, further comprising:
second upper interconnections disposed in the upper insulation and connected to the electrodes, respectively; and
second plugs connecting the logic circuit to the second upper interconnections,
wherein the second plugs are disposed in the connection region.
6. The semiconductor device of claim 5, wherein the lower insulation extends on the semiconductor substrate in the connection region, and
the stress relaxation structure terminates at a boundary between the circuit region and the connection region so as to not extend over the lower insulation in the connection region, and
the semiconductor device further comprises:
intermediate insulation disposed on the lower insulation in the connection region.
7. The semiconductor device of claim 6, wherein the first and second plugs extend through the intermediate insulation.
8. The semiconductor device of claim 3, wherein the stack is elongated in a first direction parallel to an upper surface of the semiconductor layer, and
the semiconductor layer has a common source region disposed at a side of the stack.
9. The semiconductor device of claim 8, further comprising:
a common source line connected to the common source region and extending longitudinally in the first direction.
10. The semiconductor device of claim 3, wherein each of the vertical pillars comprises:
vertical portions extending through the stack; and
a horizontal portion disposed under the stack and connecting the vertical portions to each other.
11. The semiconductor device of claim 10, wherein the stack is elongated in a first direction parallel to an upper surface of the semiconductor layer, and
the electrodes comprise:
word lines on the semiconductor layer; and a string selection line and a ground selection line disposed on the word lines and spaced apart from each other in a second direction parallel to the upper surface of the semiconductor layer and intersecting the first direction.

12. The semiconductor device of claim 1, wherein the stress relaxation structure comprises material having compressive stress.

13. The semiconductor device of claim 12, wherein the stress relaxation structure comprises a silicon nitride layer or a silicon oxynitride layer.

14. The semiconductor device of claim 1, wherein the stress relaxation structure comprises material having tensile stress.

15. The semiconductor device of claim 14, wherein the material of the stress relaxation structure has a dielectric constant lower than that of silicon oxide.

16. The semiconductor device of claim 14, wherein the material of the stress relaxation structure is a porous material.

17. The semiconductor device of claim 1, wherein the stress relaxation structure defines a cavity between the logic structure and the memory structure in the circuit region.

18. The semiconductor device of claim 17, wherein the stress relaxation structure further comprises a support extending between the logic structure and the memory structure and delimiting the cavity.

19. The semiconductor device of claim 18, wherein the support comprises at least one material selected from the group consisting of silicon oxide, silicon nitride, silicon oxynitride, poly-crystalline silicon, and metals.

20. The semiconductor device of claim 17, wherein the stress relaxation structure further comprises: a capping layer between the cavity and the memory structure.

* * * * *